(12) United States Patent
Teig et al.

(10) Patent No.: US 7,644,384 B2
(45) Date of Patent: Jan. 5, 2010

(54) METHOD AND SYSTEM FOR DISTRIBUTING CLOCK SIGNALS ON NON-MANHATTAN SEMICONDUCTOR INTEGRATED CIRCUITS

(75) Inventors: Steven Teig, Menlo Park, CA (US); Raghu Chalasani, San Jose, CA (US); Akira Fujimura, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 355 days.

(21) Appl. No.: 11/464,478

(22) Filed: Aug. 14, 2006

(65) Prior Publication Data

US 2006/0277514 A1 Dec. 7, 2006

Related U.S. Application Data

(62) Division of application No. 10/684,211, filed on Oct. 10, 2003, now Pat. No. 7,117,470.

(51) Int. Cl.
*G06F 17/50* (2006.01)
(52) U.S. Cl. .............................. 716/12; 716/11; 716/18
(58) Field of Classification Search ................. 716/11, 716/12, 18
See application file for complete search history.

(56) References Cited

U.S. PATENT DOCUMENTS

| 5,789,770 | A | * | 8/1998 | Rostoker et al. ............ 257/206 |
| 6,215,495 | B1 | | 4/2001 | Grantham et al. |
| 6,912,704 | B1 | | 6/2005 | Teig et al. |
| 7,117,470 | B1 | | 10/2006 | Teig et al. |
| 2003/0005399 | A1 | | 1/2003 | Igarashi et al. |
| 2007/0136707 | A1 | | 6/2007 | Teig et al. |

OTHER PUBLICATIONS

U.S. Appl. No. 10/684,211, filed Oct. 3, 2003, Teig, et al., Parent Application, which is now issued as U.S. Patent 7,117,470.
Restriction Requirement of U.S. Appl. No. 10/684,211, filed Sep. 16, 2005, Teig, et al., Restriction Requirement of Parent Application, which is now issued as U.S. Patent 7,117,470.
Non-Final Office Action of U.S. Appl. No. 10/684,211, filed Nov. 18, 2005, Teig, et al., Non-Final Office Action of Parent Application, which is now issued as U.S. Patent 7,117,470.
Notice of Allowance of U.S. Appl. No. 10/684,211, filed Apr. 24, 2006, Steven Teig, et al., Notice of Allowance of commonly owned U.S. Patent 7,117,470.
Non-Final Office Action of U.S. Appl. No. 11/548,655, filed Mar. 10, 2009, Steven Teig, et al., Non-Final Office Action of commonly owned U.S. Appl. No. 11/548,655.

* cited by examiner

*Primary Examiner*—Thuan Do
(74) *Attorney, Agent, or Firm*—Adeli & Tollen LLP

(57) ABSTRACT

The present invention introduces methods, systems, and architectures for routing clock signals in an integrated circuit layout. The introduced clock signal clock signal structures are rendered with non Manhattan routing. In a first embodiment, the traditional recursive H clock signal structure is rendered after transforming the coordinates system such that a rotated recursive H clock signal structure is rendered. In another embodiment, a recursive Y structure is used to create a clock signal structure. The recursive Y structure may also be implemented in a rotated alignment. For clock signal redundancy, non Manhattan wiring may be used to create a clock signal mesh network.

20 Claims, 26 Drawing Sheets

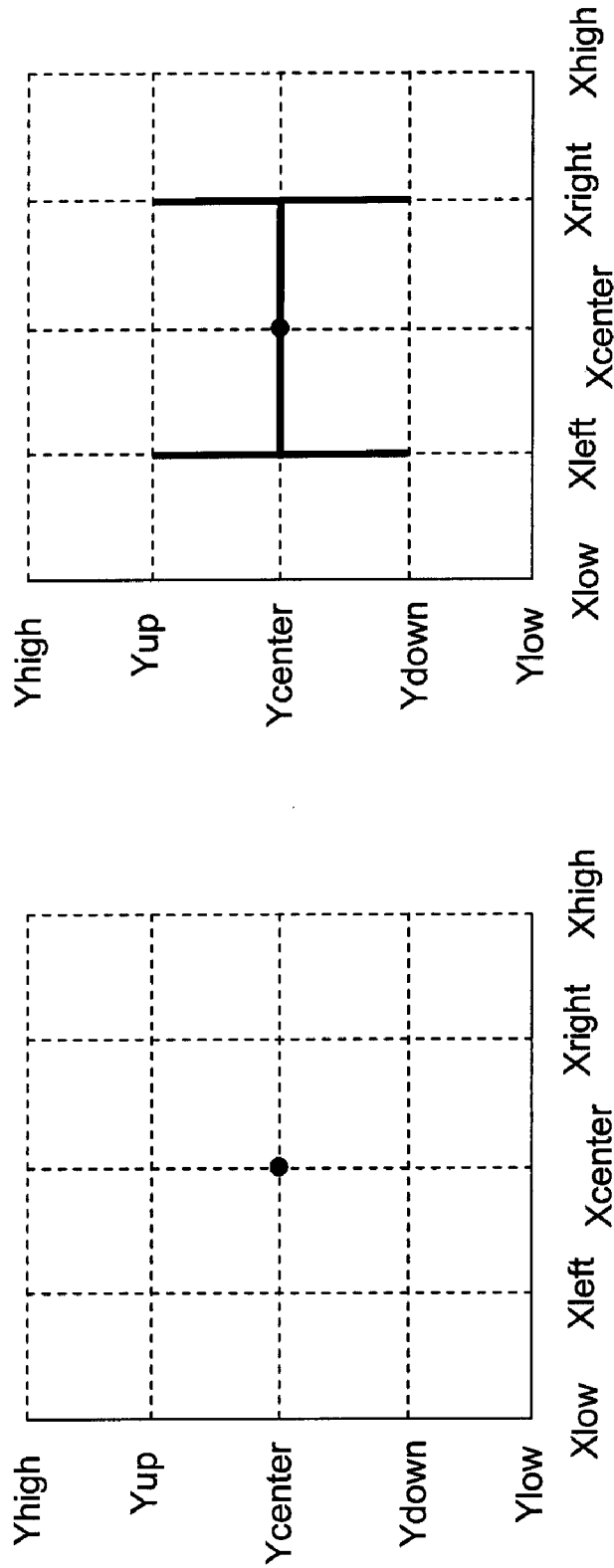

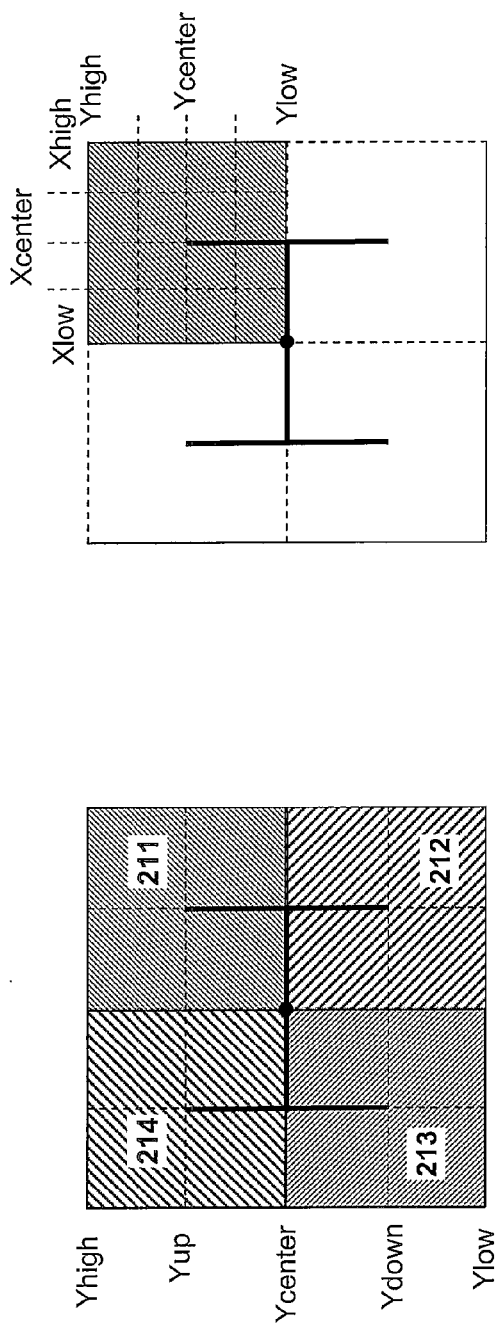
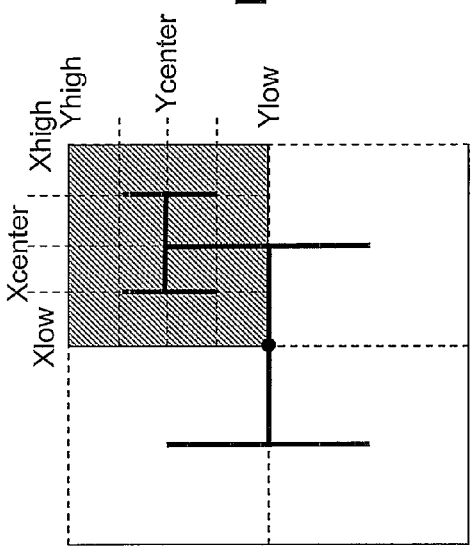
Figure 2D
Figure 2E
Figure 2C

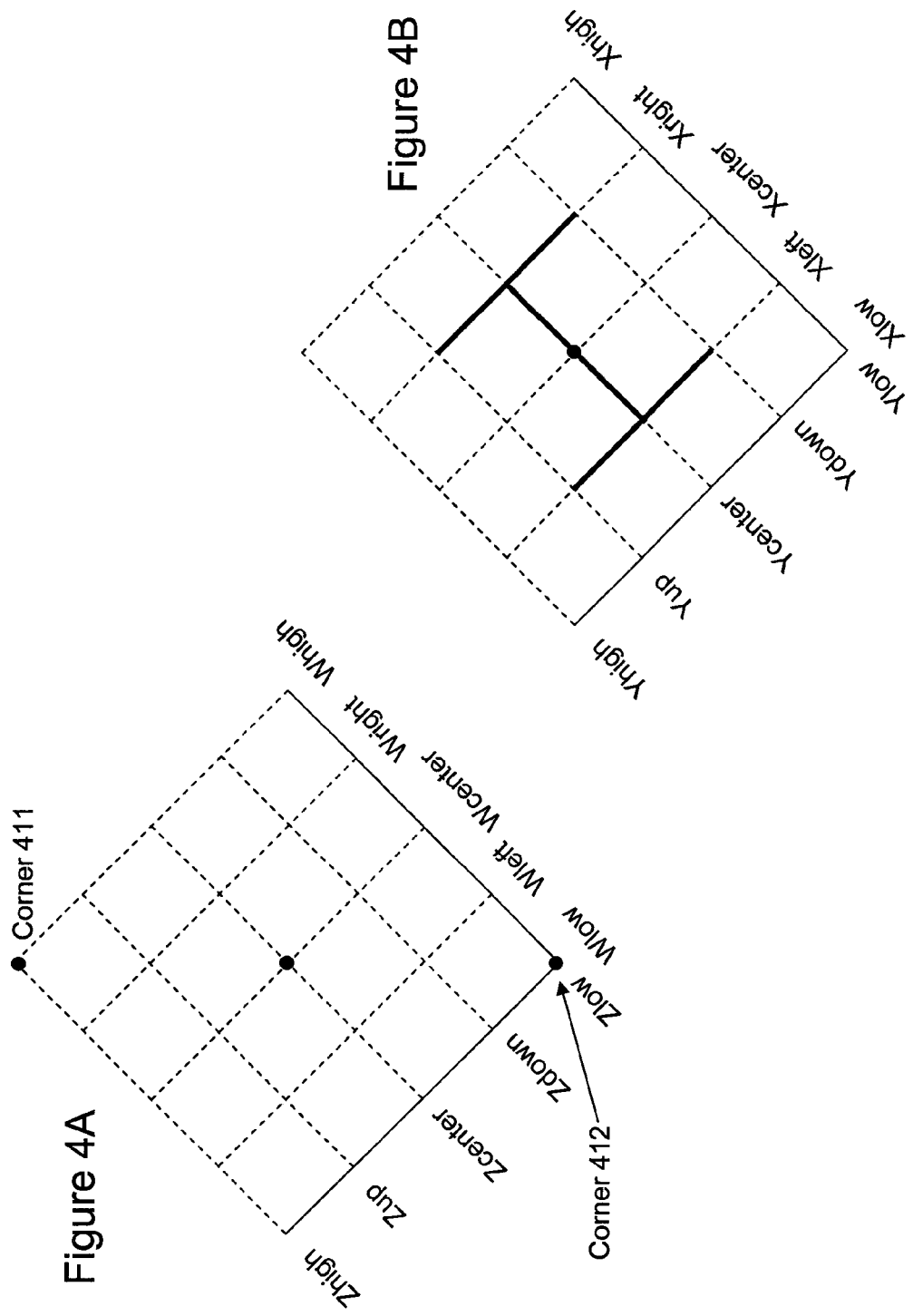

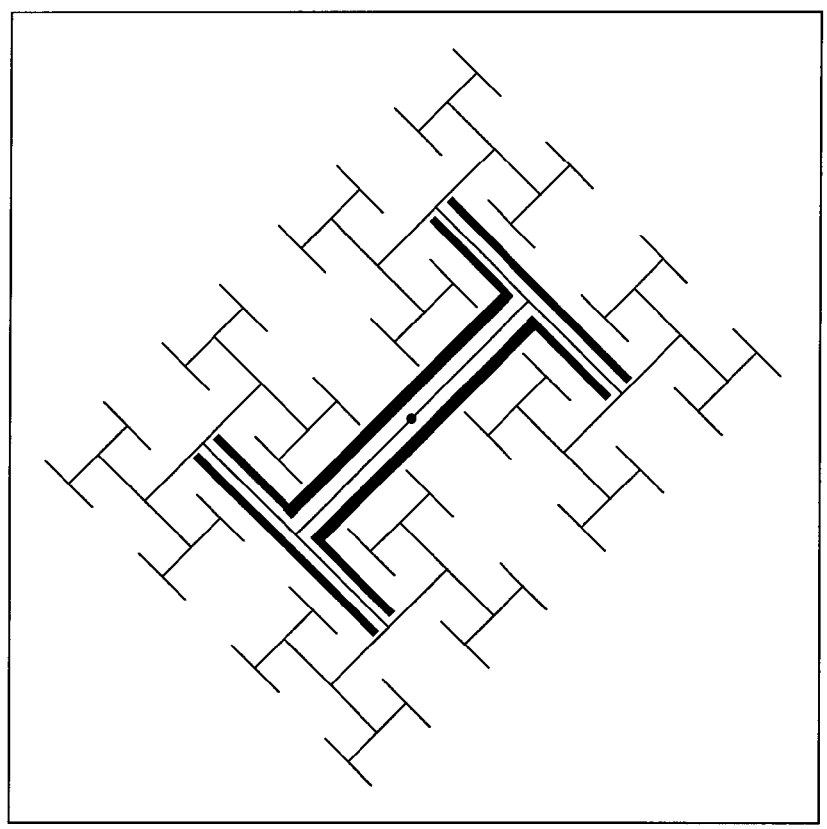

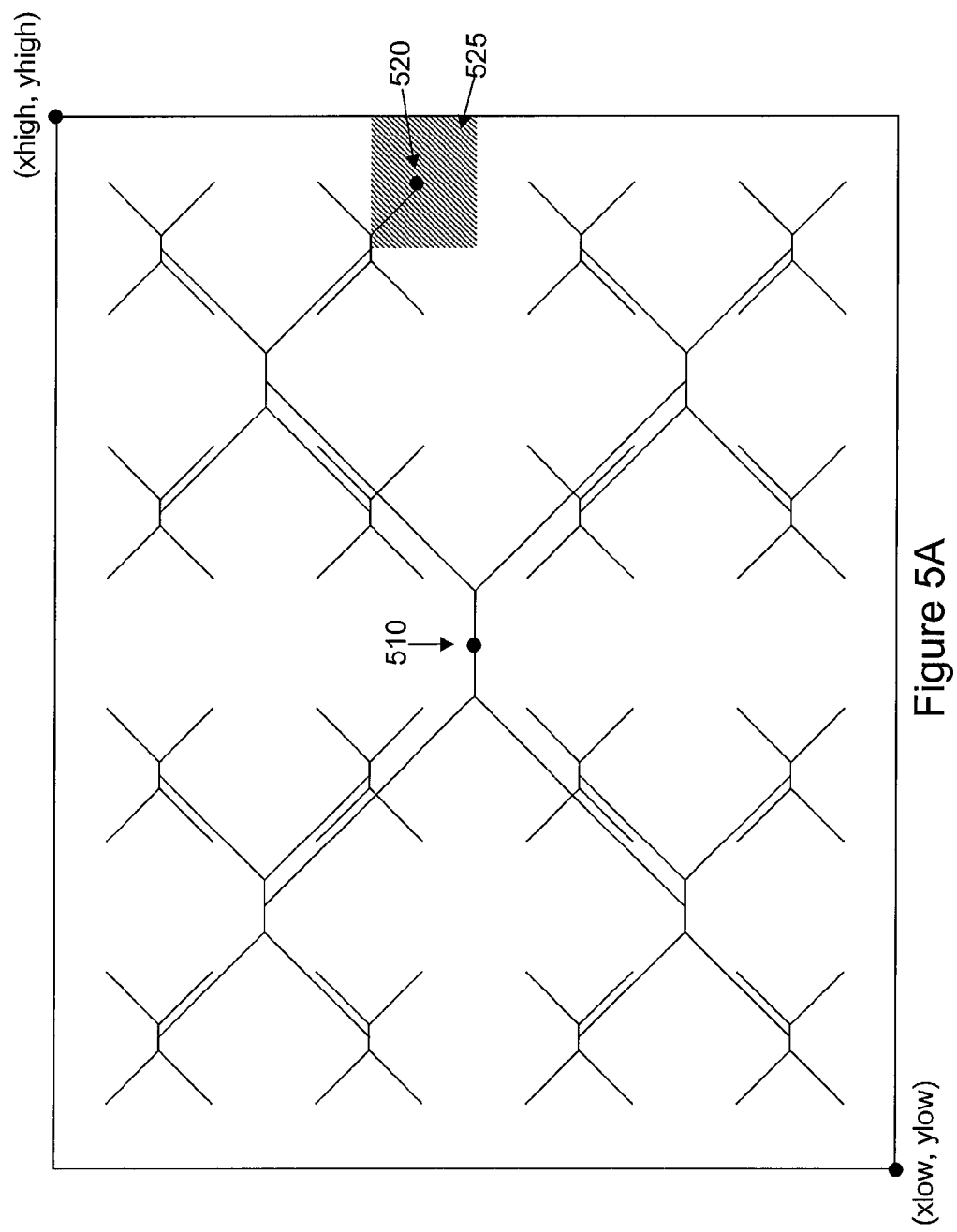

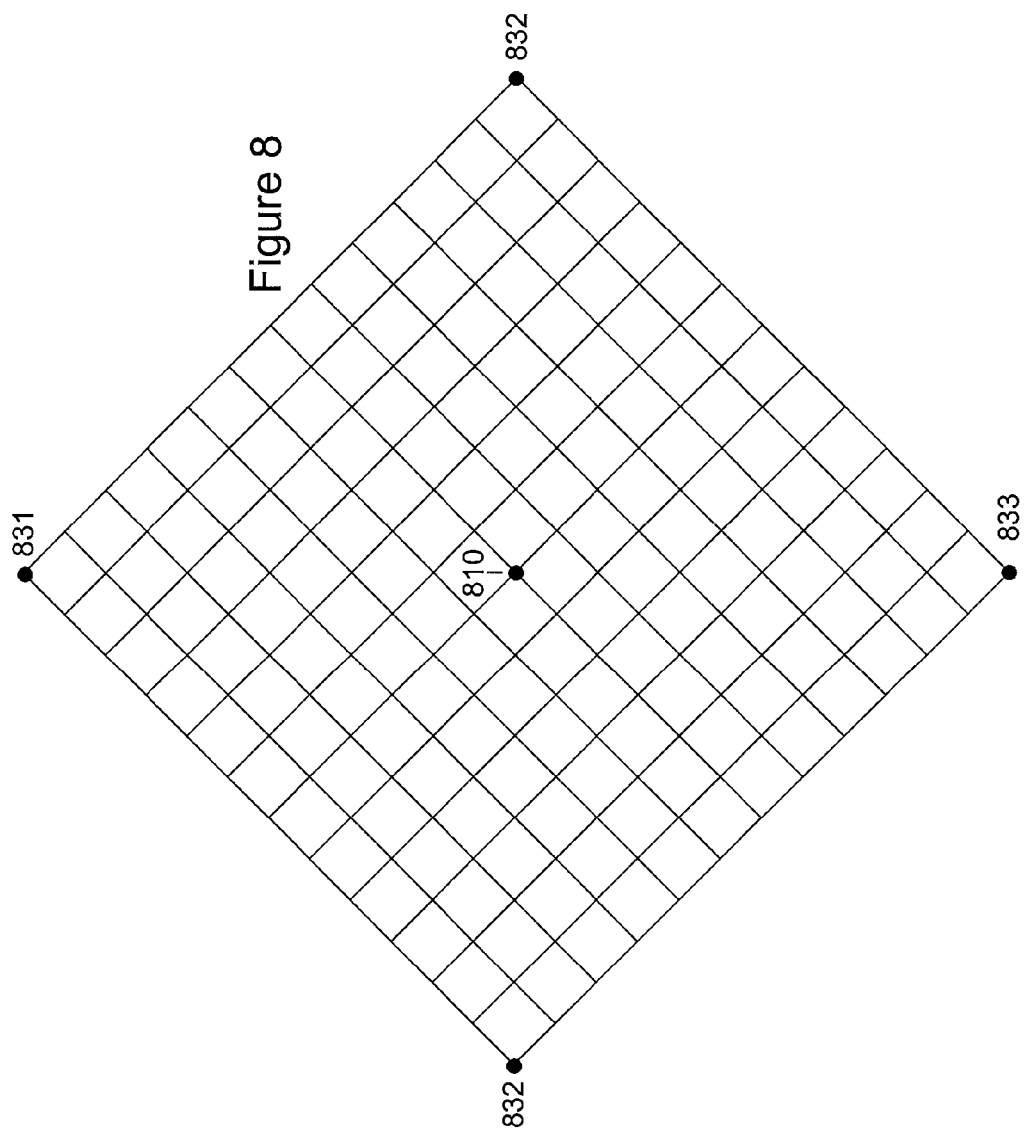

US 7,644,384 B2

METHOD AND SYSTEM FOR DISTRIBUTING CLOCK SIGNALS ON NON-MANHATTAN SEMICONDUCTOR INTEGRATED CIRCUITS

CLAIM OF BENEFIT TO RELATED APPLICATION

This application is a divisional application of U.S. Patent Application 10/684,211 filed Oct. 10, 2003 now U.S. Pat. No. 7,117,470, entitled "Methods and System for Distributing Clock Signals on Non Manhattan Semiconductor Integrated Circuits", which is incorporated herein by reference.

FIELD OF THE INVENTION

The present invention relates to the field of integrated circuit design and manufacture. In particular the present invention discloses methods and systems for distributing clock signals to the various circuit blocks on a non Manhattan semiconductor integrated circuit.

BACKGROUND OF THE INVENTION

An integrated circuit is a semiconductor device that includes many electronic components (e.g., transistors, diodes, inverters, etc.). These electrical components are interconnected to form larger scale circuit components (e.g., gates, cells, memory units, arithmetic units, controllers, decoders, etc.) on the integrated circuit. The electronic and circuit components of integrated circuits are jointly referred to below as "components." An integrated circuit also includes multiple layers of metal and/or polysilicon wiring that interconnect its electronic and circuit components.

For an integrated circuit to operate properly, all of the electronic and circuit components must operate in a synchronized manner. A 'clock signal' is used to syncrhonize the electronic and circuit components. A clock signal is generally an oscillating signal that is used by the various circuit components like a coxswain that keeps rowers in a racing shell synchronized.

To keep circuits on an integrated circuit synchronized, a clock signal must be distributed to the circuits on the integrated circuit with very little skew. However, if two different circuits are coupled to the same clock source with clock distribution lines having very different lengths, the different length clock lines will inherently cause clock skew.

To prevent such clock skew, most integrated circuits implement a special clock distribution network. The clock distribution network distributes the clock signal to a set of different areas with an equidistant clock signal lines. Each destination area is generally small enough such that differences between clock line lengths within the clock area are insignificant.

Many integrated circuits are currently fabricated with five metal layers for interconnecting circuit modules. Generally, each metal layer has a preferred wiring direction in an attempt to maximize the number of signal wires that may be placed on each wiring layer by preventing intersections. In current integrated circuits, the preferred direction alternates between successive metal layers.

Most integrated circuits use a "Manhattan" wiring model, which specifies alternating layers of horizontal and vertical preferred-direction wiring. (Viewed from above, the horizontal and vertical interconnect wires of the integrated circuit resemble the orthogonal streets of Manhattan.) In the Manhattan wiring model, essentially all of the interconnect wires are horizontal or vertical. However, new wiring systems have been introduced that allow diagonal (non Manhattan) interconnect wiring. Diagonal wiring allows different circuits that are separated by a diagonal distance to be coupled with a shorter diagonal wire instead of using a longer combination of vertical and horizontal wires.

In addition to connecting integrated circuit components, non Manhattan wiring can be used to distribute clock signals. Thus, a new set of clock signal wiring structures that have been designed with the premise of non Manhattan wiring would be desirable for maximizing the efficiencies of non Manhattan wiring.

SUMMARY OF THE INVENTION

The present invention introduces methods, systems, and architectures for routing clock signals in an integrated circuit layout. The introduced clock signal clock signal structures are rendered with non Manhattan routing. In a first embodiment, the traditional recursive H clock signal structure is rendered after transforming the coordinates system such that a rotated recursive H clock signal structure is rendered. In another embodiment, a recursive Y structure is used to create a clock signal structure. The recursive Y structure may also be implemented in a rotated alignment. For clock signal redundancy, non Manhattan wiring may be used to create a clock signal mesh network.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which:

FIG. 2A illustrates a clock bounding box that has been sub-divided.

FIG. 2B illustrates the sub-divided clock bounding box of FIG. 2A with a first H structure.

FIG. 2C illustrates the clock bounding box of FIG. 2B that has been further broken down into four sub-areas.

FIG. 2D illustrates the clock bounding box of FIG. 2C wherein one of the sub-areas has been sub-divided.

FIG. 2E illustrates the clock bounding box of FIG. 2D wherein the sub-area has an added "H" clock distribution structure.

FIG. 4A illustrates a rotated clock signal bounding box that has been sub-divided.

FIG. 4B illustrates the rotated sub-divided clock bounding box of FIG. 4A with a first "H" clock signal distribution structure.

FIG. 4D illustrates the rotated H clock signal distribution network of FIG. 4C with additional shielding added to root clock signal lines.

FIG. 5A illustrates a first example of a recursive "Y" clock signal distribution network using 45 degree and –45 degree angle wiring.

FIG. 8 illustrates an example of a square mesh clock signal distribution structure constructed using 45 degree and −45 degree angle wiring.

DETAILED DESCRIPTION OF THE PREFERRED EMBODIMENT

Figure 1:
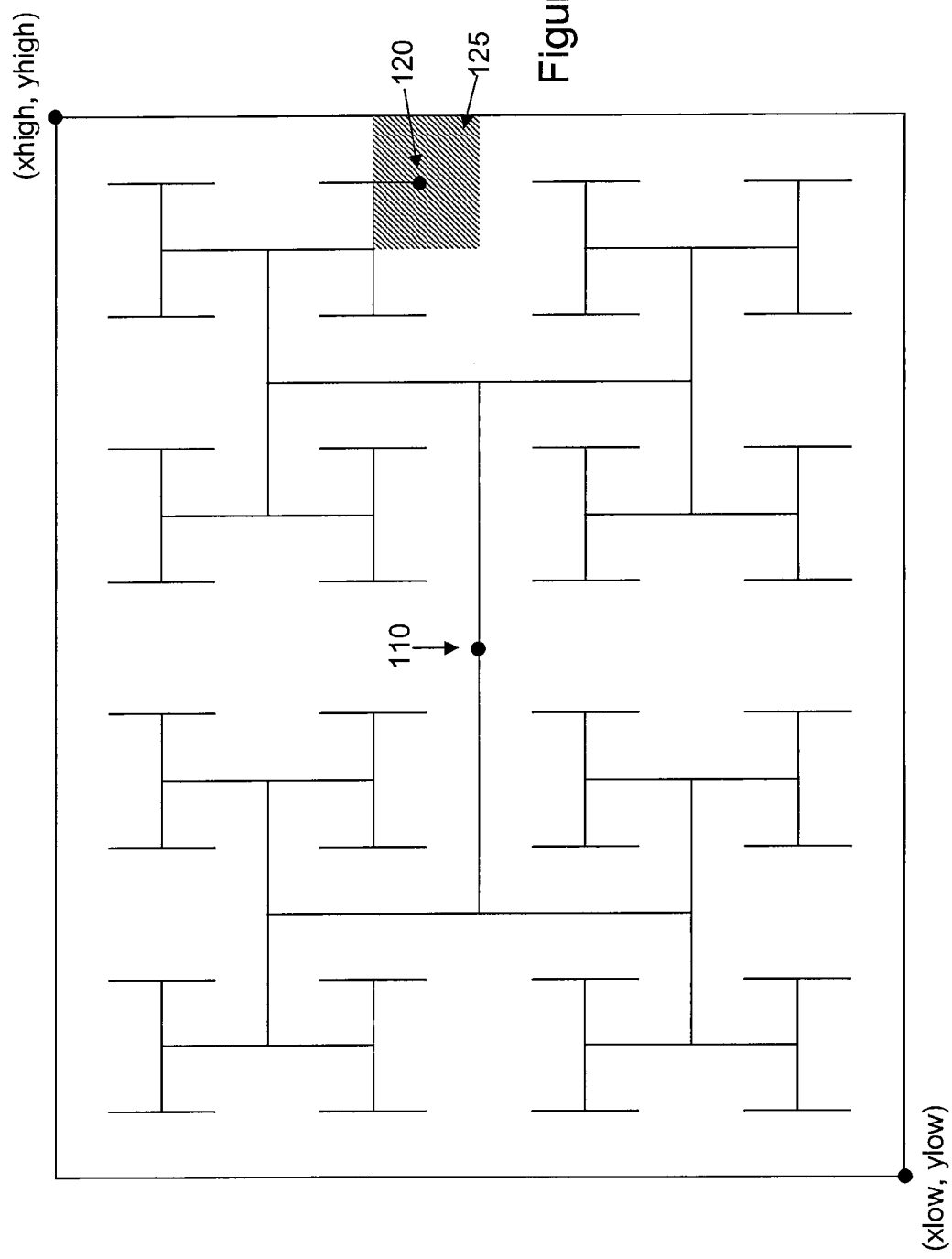
FIG. 1 illustrates a clock distribution network for an integrated circuit.

Methods and systems for distributing clock signals on non Manhattan semiconductor integrated circuits are disclosed. In the following description, for purposes of explanation, specific nomenclature is set forth to provide a thorough understanding of the present invention. However, it will be apparent to one skilled in the art that these specific details are not required in order to practice the present invention. For example, the present invention discloses example layouts that use forty-five and sixty degree angle diagonal wiring. However, the teachings of the present invention may be used non Manhattan wiring of any angle.

Wire Routing Architectures

Most existing semiconductors use the "Manhattan" wiring model that specifies alternating layers of preferred-direction horizontal and vertical wiring. In the Manhattan wiring model, the majority of the interconnect signals are horizontal or vertical. However, occasional diagonal jogs are sometimes allowed on the preferred horizontal and vertical layers.

The Manhattan wiring model has proven to be useful, but it is certainly not optimal. Distant pins must often be connected by long stretches of connected horizontal and vertical interconnect signals. To provide a more optimal system, a related patent application title "Multi-Directional Wiring On A Single Metal Layer", filed on Dec. 12, 2000 and having Ser. No. 09/733,104, incorporated by reference, uses a non Manhattan wiring model that uses diagonal wiring as a "preferred" direction for some wiring layers. With a non Manhattan architecture, diagonally separated pins can be coupled with a shorter diagonal wiring instead of a longer combination of horizontal and vertical wiring.

In one embodiment of a non Manhattan architecture, the diagonal wiring consists of wires deposed at plus 45 degrees or minus 45 degrees (referred to herein as "octalinear"). This wiring architecture is referred to as octalinear wiring in order to convey that an interconnect line can traverse in eight separate directions from any given point.

In general, metal layers on integrated circuit are typically organized in perpendicular metal layer pairs. The use of perpendicular metal layer pairs minimizes wiring distances by minimizing the number of layers a wire or via must transverse to get to a layer with wires disposed in an orthogonal direction. In addition, the use of perpendicular wiring in adjacent layers eliminates wires routed in parallel on adjacent layers, thus reducing electrical coupling between metal layers and minimizes noise interference.

Some embodiments of the present invention are described using "complementary" pairs of wiring layers. As used herein, complementary pairs refer to two wiring layers with a preferred wiring direction perpendicular to one another or close to perpendicular to each other. For example, a complementary layer to a vertical wiring layer is a horizontal wiring layer. In diagonal wiring, a complementary direction to a plus 45 degree wiring direction is a negative 45 degree wiring direction.

The use of diagonal wiring more efficiently routes wires in an integrated circuit by reducing the length of the required interconnects wires. Many different combinations of wiring layers may be used. However, it has been found convenient to use Manhattan geometries for the first two metal layers (layers one and two) for compatibility reasons. Specifically, the use of horizontal and vertical preferred directions for layers one and two is desirable since many existing circuit libraries are designed for integrated circuits that will have horizontal and vertical preferred wiring for layers one and two. Many different types of metal layers may be placed on top of the first two Manhattan metal layers. In one embodiment, the next two layers are plus 45 degree wiring and negative 45 degree wiring. The use of horizontal and vertical preferred directions for the first three layers is desirable in some circumstances since some complex circuit libraries are designed for integrated circuits that have three Manhattan layers. The first three layers may be horizontal, vertical, horizontal (HVH); or vertical, horizontal, vertical (VHV).

To fully take advantage of the efficiencies of the non Manhattan architecture, the electronic design automation ("EDA") applications for designing, editing, and analyzing integrated circuits must take into consideration the wire length savings for diagonal interconnect lines for diagonally separated pins, diagonal wiring congestion, and other factors related to diagonal wiring. The present invention concerns the distribution of clock signals on integrated circuits having non Manhattan wiring architectures.

Manhattan Architecture Clock Signal Distribution

A clock signal distribution network is generally used to distribute a clock signal to the various areas of an integrated circuit. The goal of a clock signal network is to distribute the clock signal to each and every circuit that requires the use of the clock signal. The clock signal distribution is performed using a clock signal distribution lines of equal length. By having equal-length clock distribution lines, the clock skew will be kept to a minimum.

Recursive H

FIG. 1 illustrates a common prior art approach to clock signal distribution. FIG. 1 illustrates a clock signal distribution network that is known as the "recursive H" distribution system since it is comprised of a recursive series of progressively smaller "H" structures that distribute the clock signal. The clock signal source is applied to the center 110 and then spreads through the network until it reaches one of the end points. Each endpoint drives an individual 'clock domain', an area that uses the same clock signal. For example, endpoint 120 drives clock domain 125 that is denoted using a shaded area.

The recursive H clock distribution network can be created using recursive computer code. For example, the following computer pseudo code can be used to create a recursive H clock distribution structure in a rectangular area defined by the corner points 0, 0 and 100,100:

```
Main( ) {
    Xlow = 0
    Ylow = 0
    Xhigh = 100
    Yhigh = 100
    CreateH (Xlow, Ylow, Xhigh, Yhigh)
}
    // Define the recursive CreateH routine
    CreateH (Xlow, Ylow, Xhigh, Yhigh) {
        // Determine Center, Left, Right, Up, and Down points
        Xcenter = (Xlow + Xhigh)/2
        Ycenter = (Ylow + Yhigh)/2
        Xright = (Xcenter + Xhigh)/2
        Xleft = (Xlow + Xcenter)/2
        Yup = (Ycenter + Yhigh)/2
        Ydown = (Ylow + Ycenter)/2
        // Draw the "H"
        DrawLine (Xleft, Ycenter, Xright, Ycenter)
        DrawLine (Xright, Yup, Xright, Ydown)
        DrawLine (Xleft, Yup, Xleft, Ydown)
        // Determine if we are done, if we are not, go deeper.
        If (deepEnough(Xlow, Ylow, Xhigh, Yhigh) then return;
        Else { // Not deep enough yet
            CreateH (Xcenter, Ycenter, Xhigh, Yhigh)
            CreateH (Xcenter, Ylow, Xhigh, Ycenter)
            CreateH (Xlow, Ylow, Xcenter, Ycenter)
            CreateH (Xlow, Ycenter, Xcenter, Yhigh)
        }
    }
```

Note that the 'deepEnough()' function determines if the system has recursed deep enough by examining the size of the clock area bounding box.

FIGS. 2A to 2E illustrate an example of the recursive H system. In FIG. 2A, the bounding box from (Xlow, Ylow) to (Xhigh, Yhigh) is first subdivided with Xleft, Xright, Yup, and Ydown lines. Then, the first H is drawn using those subdivisions as illustrated in FIG. 2B.

Next, the system determines if function needs to further sub-divide the area. If further subdivision is required, the function calls itself on four sub-areas with bounding boxes (Xcenter, Ycenter) to (Xhigh, Yhigh); (Xcenter, Ylow) to (Xhigh, Ycenter); (Xlow, Ylow) to (Xcenter, Ycenter); and (Xlow, Ycenter) to (Xcenter, Yhigh). These areas are illustrated as areas 211, 212, 213, and 214, respectively, in FIG. 2C. For example, FIG. 2D illustrates the further sub-division of area 211. After the subdivision, FIG. 2E illustrates the added H structure.

Non Manhattan Architecture Clock Signal Distribution

With a non Manhattan wiring architecture, a number of new clock signal distribution systems may be employed.

Rotated Manhattan Clock Distribution Networks

One method of creating clock distribution networks in a non Manhattan architecture integrated circuit is to rotate existing Manhattan architecture clock distribution networks. For example, one new clock signal distribution system that may be employed is a rotated "H" structure. A rotated H is similar to the normal H structure but rotated 45 degrees.

One elegant method of creating such non Manhattan clock distribution networks is to use the same code that was used to implement the Manhattan-based recursive H clock signal distribution system with a slight modification. Specifically, one only needs to transform into a different coordinate system, generate the clock signal distribution structure, and then transform back.

Figure 3:
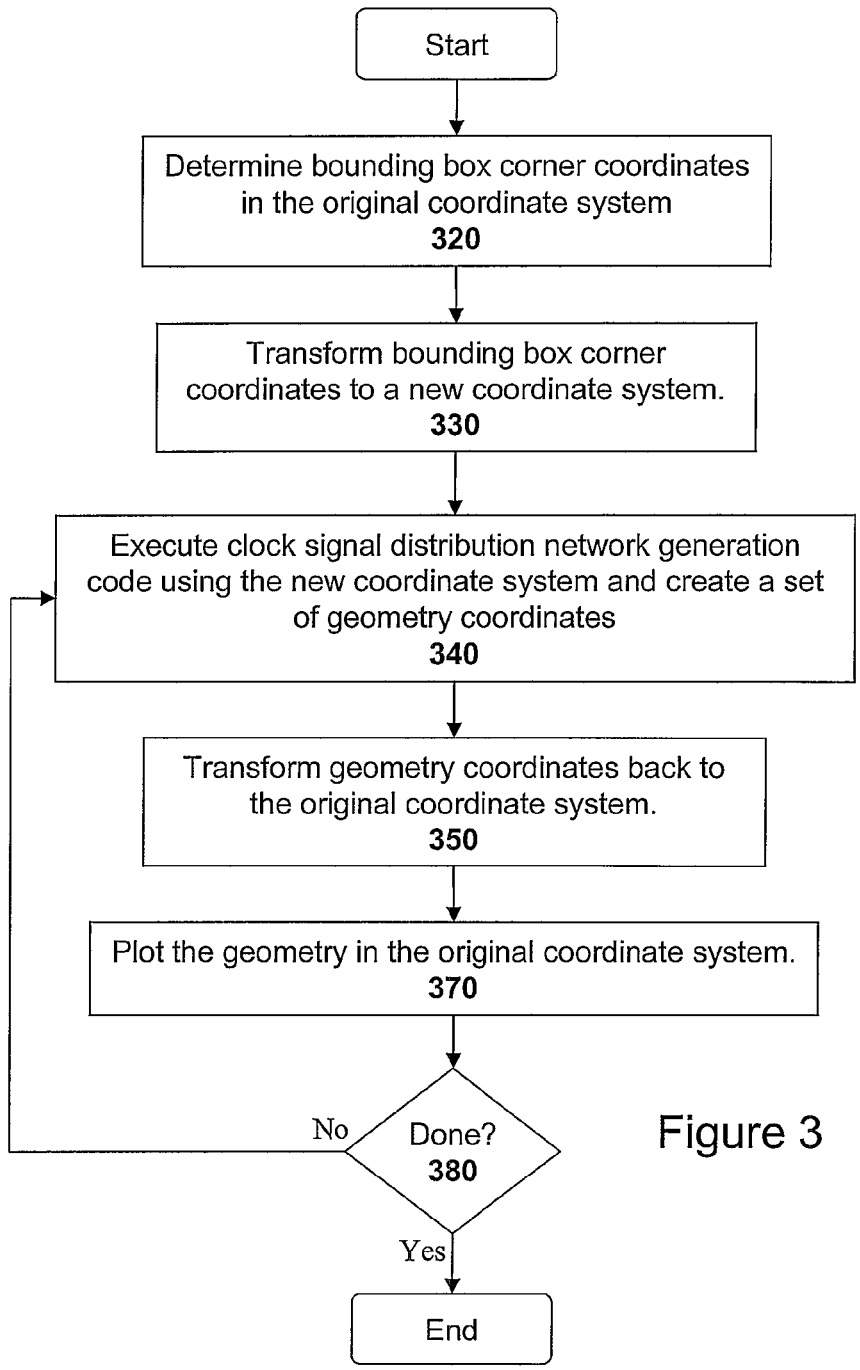
FIG. 3 illustrates a flow diagram that describes a method of using existing clock signal distribution network generation code to create non Manhattan clock signal distribution networks.

FIG. 3 illustrates a simple flow chart that describes how this may be done. Initially, at step 320, a set of bounding box coordinates is created in the original coordinate system. Note that the bounding corners will be mostly vertically separated since the bounding box is rotated as illustrated in FIG. 4A with corners 411 and 412.

Referring back to FIG. 3, the bounding box coordinates are transformed into the new coordinate system at step 330. The coordinates maybe transformed from an (X, Y) domain to a different (W, Z) domain. The system may perform the transform from the (X, Y) domain to the (W, Z) domain using the following equations:

$$W=Y-X$$

$$Z=Y+X$$

The system may perform the transform from the (W, Z) domain back to the (X, Y) domain to the using the following equations:

$$X=(Z-W)/2$$

$$Y=(Z+W)/2$$

After the bounding box coordinates have been transformed at step 330, the geometry may be rendered. Note that the same clock signal distribution network generation code may be used to generate a set of geometry coordinates as set forth in step 340. However, before the final rendering is performed, the geometry coordinates must be transformed back to the original (X, Y) coordinate system at step 350. Then, at step 370, the geometry coordinates in the original coordinate system may be plotted. The system may repeat through a number of iterations until the entire desired clock signal distribution network has been created.

FIG. 4B illustrates how the rotated bounding box of FIG. 4A will appear after a single iteration of the rotated H method. Note that although this example has been provided with reference to the recursive H clock signal distribution network, the method of FIG. 3 may be applied to any existing Manhattan architecture based clock signal distribution network.

Figure 4C:
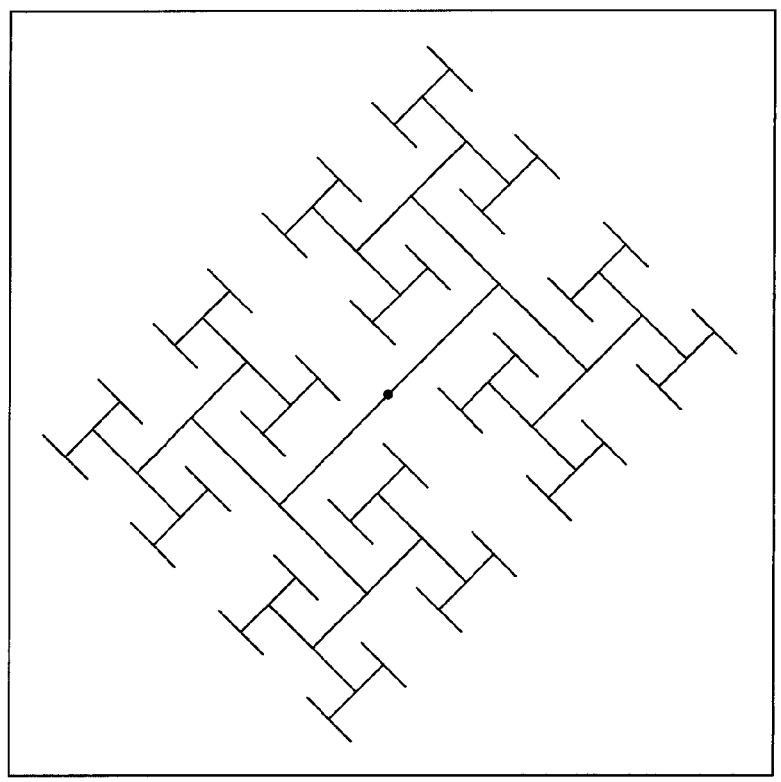
FIG. 4C illustrates an example embodiment of a rotated H clock signal distribution network.

Successive iterations of the steps listed in FIG. 3 as shown in conjunction with the diagonal embodiment of FIG. 4A and 4B will produce a rotated H clock distribution network. FIG. 4C illustrates an example of a rotated H clock distribution network.

The following pseudo code is the previous pseudo code only slightly modified in order to draw a rotated H structure:

```
Main( ) {
    Xlow = 100
    Ylow = 0
    Xhigh = 100
    Yhigh = 100
    Wlow = XYtoW(Xlow, Ylow)
    Zlow = XYtoZ(Xlow, Ylow)
    Whigh = XYtoW(Xhigh, Yhigh)
    Zhigh = XYtoZ(Xhigh, Yhigh)
    CreateRotH (Wlow, Zlow, Whigh, Zhigh)
}
    CreateRotH (Wlow, Zlow, Whigh, Zhigh) {
       // Determine Center, Left, Right, Up, and Down points
       Wcenter = (Wlow + Whigh)/2
       Zcenter = (Zlow + Zhigh)/2
       Wright = (Wcenter + Whigh)/2
       Wleft = (Wlow + Wcenter)/2
       Zup = (Zcenter + Zhigh)/2
       Zdown = (Zlow + Zcenter)/2
       // Draw the "H"
       // Convert and then draw line
       X1 = WZtoX(Wleft, Zcenter)
       Y1 = WZtoY(Wleft, Zcenter)
       X2 = WZtoX(Wright, Zcenter)
       Y2 = WZtoY(Wright, Zcenter)
       DrawLine (X1, Y1, X2, Y2)
       // Convert and then draw line
       X1 = WZtoX(Wright, Zup)
       Y1 = WZtoY(Wright, Zup)
       X2 = WZtoX(Wright, Zdown)
       Y2 = WZtoY(Wright, Zdown)
       DrawLine (X1, Y1, X2, Y2)
       // Convert and then draw line
       X1 = WZtoX(Wleft, Zup)
       Y1 = WZtoY(Wleft, Zup)
       X2 = WZtoX(Wleft, Zdown)
       Y2 = WZtoY(Wleft, Zdown)
       DrawLine (X1, Y1, X2, Y2)
       // Determine if we are done, if we are not, go deeper.
       If (DeepEnough(Wlow, Zlow, Whigh, Zhigh) then return;
       Else { // Not deep enough yet
          CreateH (Wcenter, Zcenter, Whigh, Zhigh)
          CreateH (Wcenter, Zlow, Whigh, Zcenter)
          CreateH (Wlow, Zlow, Wcenter, Zcenter)
          CreateH (Wlow, Zcenter, Wcenter, Zhigh)
       }
    }
    function XYtoW(Xin, Yin) {
       XYtoW = Yin – Xin
    }
    function XYtoZ(Xin, Yin) {
       XYtoZ = Yin + Xin
    }
    function WZtoX(Win, Zin) {
       WZtoX = (Zin – Win)/2
    }
    function WZtoY(Win, Zin) {
       WZtoY = (Zin + Win)/2
    }
```

In a preferred embodiment, both the Manhattan and the non Manhattan clock signal distribution network generation code are in the same routine. Thus, the user of the code simply sets a flag or a parameter that specifies to the clock signal distribution network generation code whether it should implement the recursive H structure in the standard Manhattan orientation or in the non Manhattan (rotated) orientation. The parameter may comprise a rotation value that specifies a rotation angle at which the clock signal distribution network should be rendered.

Y Clock Signal Distribution Network

In addition to placing the existing Manhattan architecture clock distribution networks, non Manhattan wiring allows new clock distribution networks to be created. One type of clock signal distribution network that may be created is a "Y" clock distribution network that is similar to the "H" clock distribution network except that the "Y" clock distribution network takes advantage of having non Manhattan wiring. The "Y" clock distribution network uses individual structures that appear like two "Y" letters combined at their bottoms. Specifically, the main recursive pattern is a root signal line with non Manhattan leave signal lines extending from either end of the root signal line.

FIG. 5A illustrates a "Y" clock distribution network that distributes clock signals to the same destinations as the "H" clock distribution network of FIG. 1. In the "Y" clock distribution network of FIG. 5A, the 45 degrees and −45 degrees angled wiring shorten the distance that the clock signal must travel. Thus, less power is required and less skew is created.

The following pseudo code can be used to create a "Y" clock distribution network structure:

```
Xlow = 0
Ylow = 0
Xhigh = 200
Yhigh = 100
CreateY (Xlow, Ylow, Xhigh, Yhigh)
CreateY (Xlow, Ylow, Xhigh, Yhigh) {
    // Determine Center, Left, Right, Up, and Down points
    Xcenter = (Xlow + Xhigh)/2
    Ycenter = (Ylow + Yhigh)/2
    Xright = (Xcenter + Xhigh)/2
    Xleft = (Xlow + Xcenter)/2
    Yup = (Ycenter + Yhigh)/2
    Ydown = (Ylow + Ycenter)/2
    Xrightend = Xright – (Yup – Ycenter)
    Xleftend = Xleft + (Yup – Ycenter)
    // Draw the "Y"
    DrawLine (Xleftend, Ycenter, Xrightend, Ycenter)
    DrawLine (Xrightend, Ycenter, Xright, Yup)
    DrawLine (Xrightend, Ycenter, Xright, Ydown)
    DrawLine (Xleftend, Ycenter, Xleft, Yup)
    DrawLine (Xleftend, Ycenter, Xleft, Ydown)
    // Determine if we are done, if we are not, go deeper.
    If (deepEnough(Xlow, Ylow, Xhigh, Yhigh) then return;
    Else { // Not deep enough yet
       CreateY (Xcenter, Ycenter, Xhigh, Yhigh)
       CreateY (Xcenter, Ylow, Xhigh, Ycenter)
       CreateY (Xlow, Ylow, Xcenter, Ycenter)
       CreateY (Xlow, Ycenter, Xcenter, Yhigh)
    }
}
```

Figure 5B:
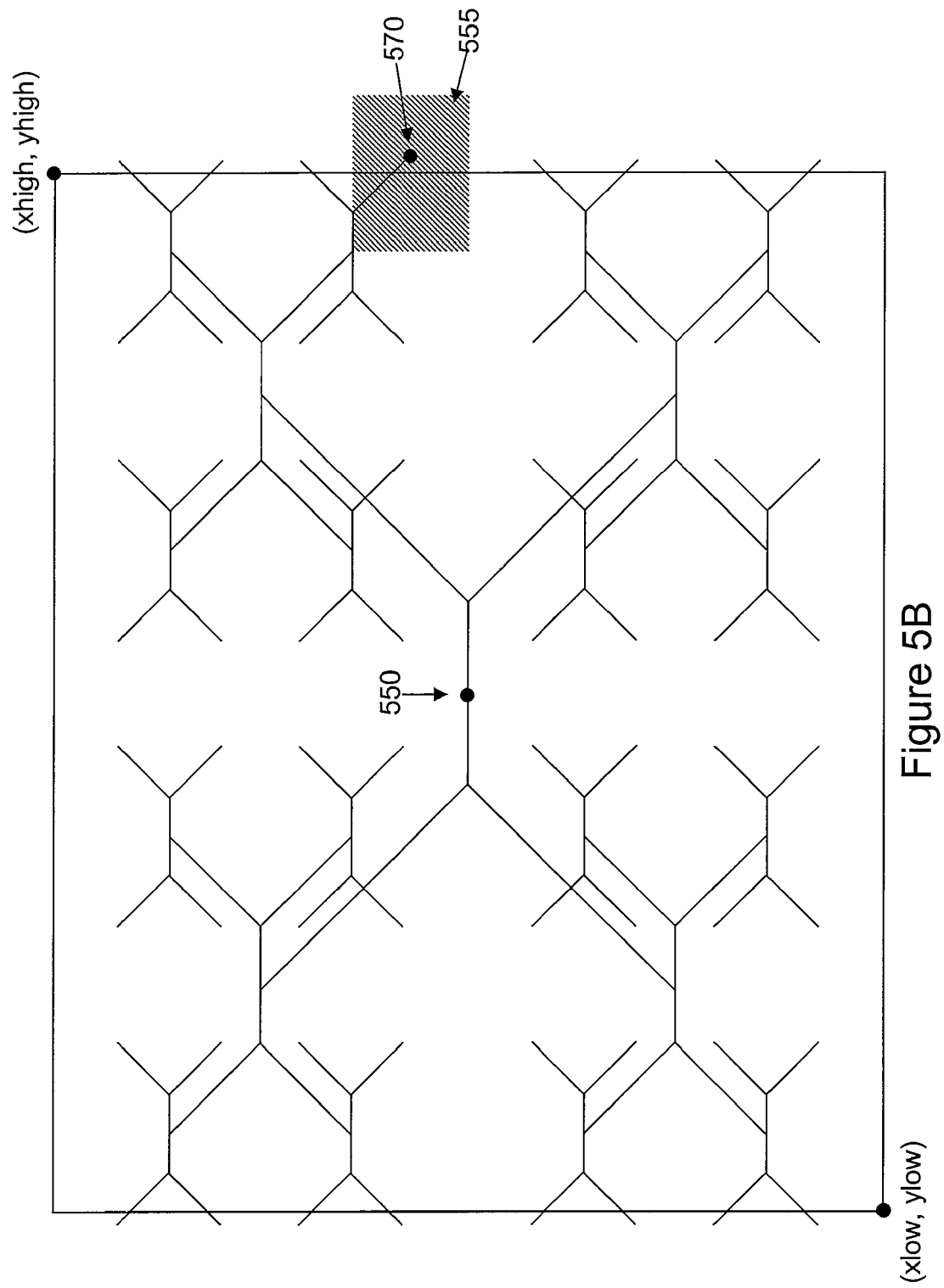
FIG. 5B illustrates a second example of a recursive "Y" clock signal distribution network using 45 degree and –45 degree angle wiring.

Referring to FIG. 5A, it can be seen that some of the wiring at 45 degrees and −45 degrees are very close to each other. Such close together wiring may be difficult to manufacturer reliably or cause undesirable crosstalk. To avoid such a situation, one may lengthen the horizontal cross-member of the double "Y" structure. Such an implementation is illustrated in FIG. 5B. However, this will separate the clock distribution network endpoints by a fair distance.

Figure 6A:
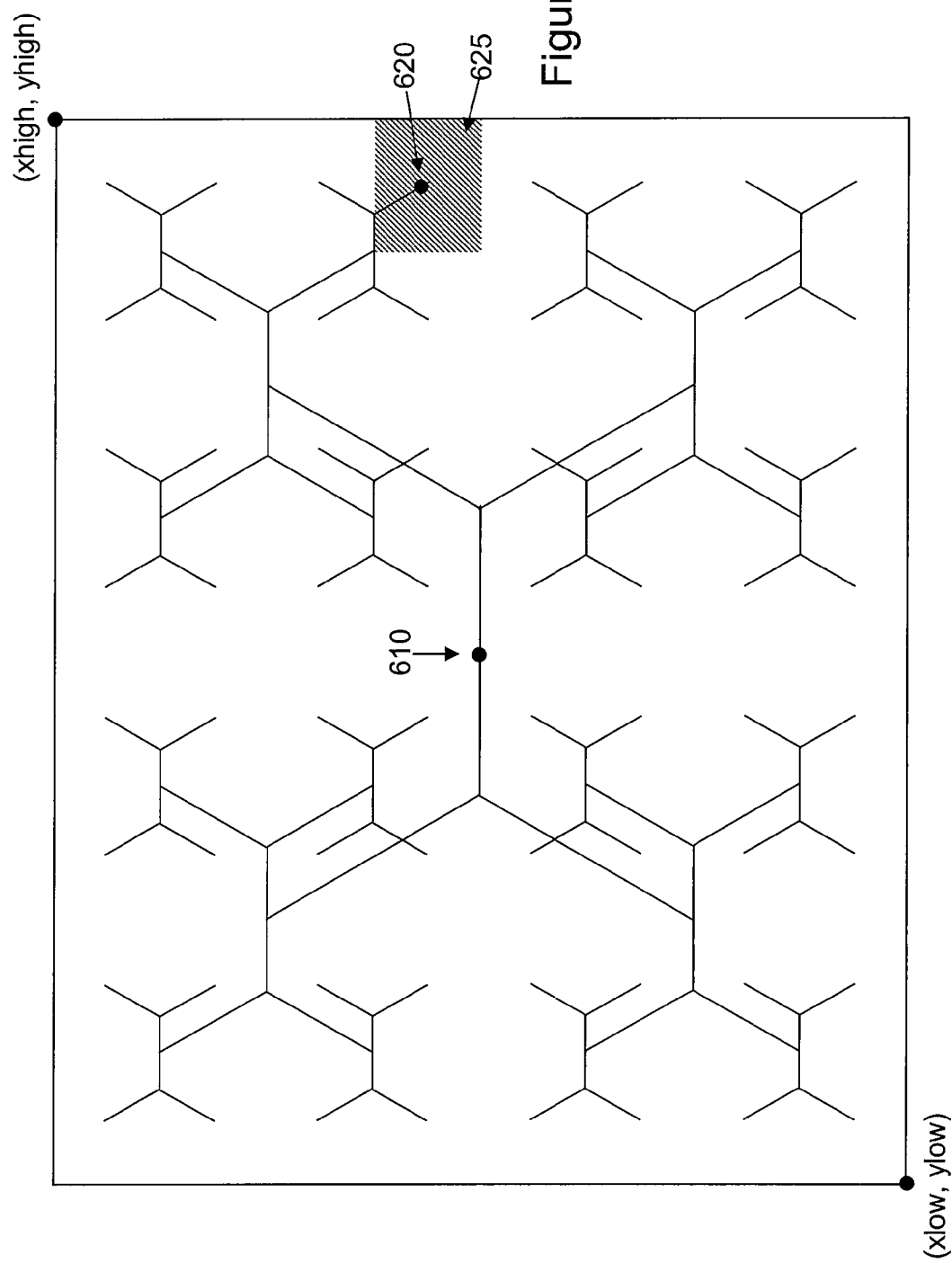
FIG. 6A illustrates a first example of a recursive "Y" clock signal distribution network using 60 degree and −60 degree angle wiring.

Another method of alleviating the problem is to use a different non Manhattan wiring angle. FIG. 6A illustrates a clock signal distribution network that uses 60 degree and −60 degree angle diagonal wiring. The clock signal distribution network of FIG. 6A distributes the clock signal to the same destinations as FIG. 1 and FIG. 5. However, the embodiment of FIG. 6A delivers the clock signal to the same areas as the standard H of FIG. 1 using shorter clock signal wiring. The embodiment of FIG. 6A also delivers the clock signal to the same areas as the Y clock signal network of FIG. 5A but without the possible manufacturing difficulties of the embodiment of FIG. 5A caused by the close parallel clock signal lines.

Rotated Y Clock Signal Distribution Network

Figure 6B:
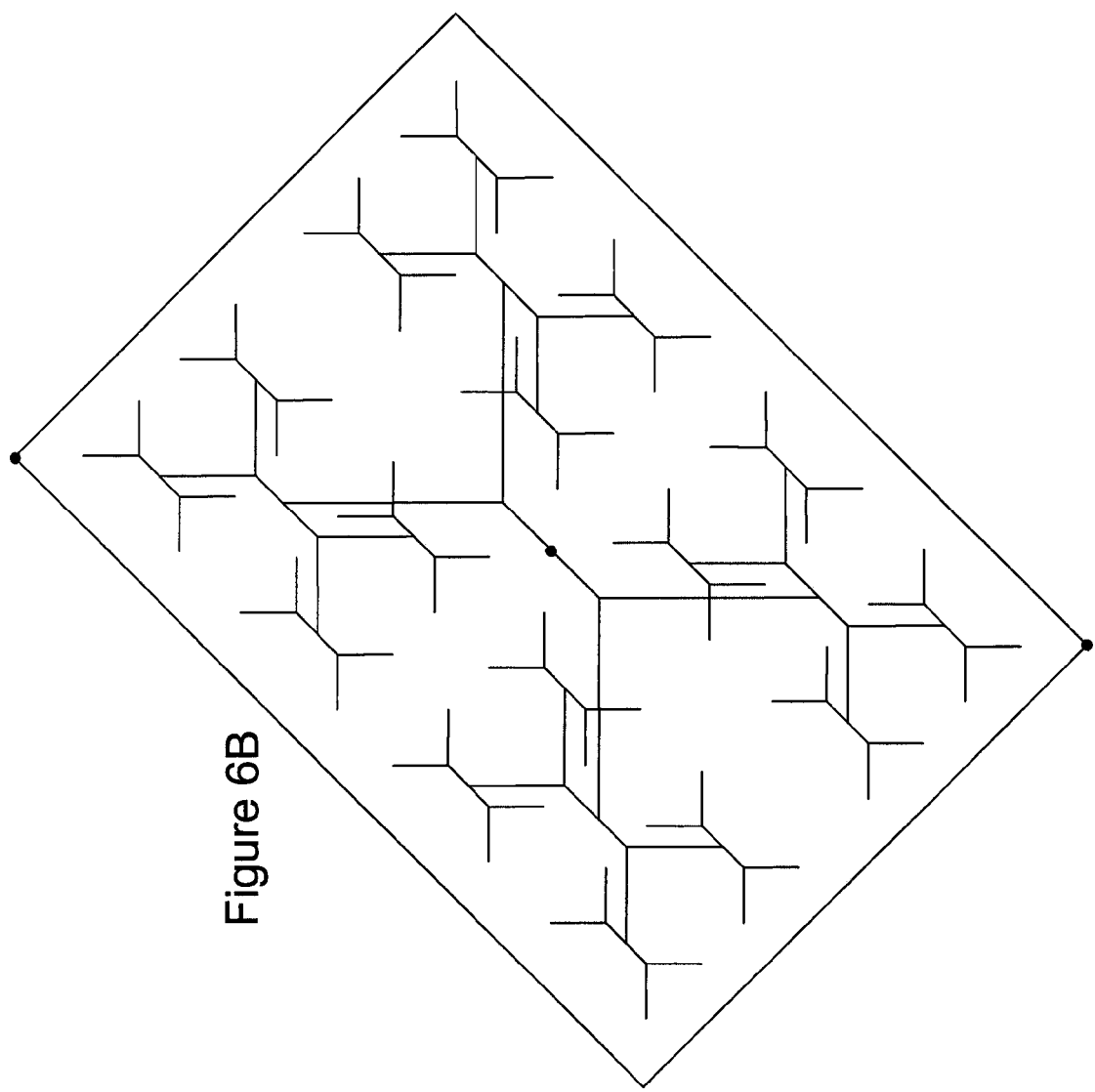
FIG. 6B illustrates an example of a rotated recursive "Y" clock signal distribution network using 45 degree and −45 degree angle wiring.

In addition to rotating the older Manhattan based clock signal distribution networks, the new non Manhattan based clock signal distribution networks may also be rotated. Specifically, the teachings of the flowchart in FIG. 3 that describes how to rotate Manhattan based clock signal distribution networks can be used to rotate non Manhattan based clock signal distribution networks. FIG. 6B illustrates an example of a rotated Y clock signal distribution network.

As with the "H" implementation, a preferred embodiment of the "Y" clock signal distribution network generation code can generate both the Manhattan and the non Manhattan versions in the same routine. Thus, the user of the code simply sets a flag or a parameter to inform the clock signal distribution network generation code whether it should implement the Y clock network in the normal orientation or in the rotated orientation. An even more comprehensive implementation would allow the user to specify if the clock structure should be an H structure or a Y structure and whether the clock structure should be rotated or not. The code may allow the user to specify a rotation value that specifies a rotation angle at which the clock signal distribution network should be rendered.

Herringbone Clock Signal Distribution Networks

Another clock signal distribution architecture that may be used is a herringbone structure constructed using non Manhattan wiring. The herringbone clock signal distribution architecture has the advantage of using the higher level non Manhattan layers for clock distribution such that the clock signals will not be adjacent to circuit wiring.

Figure 7A:
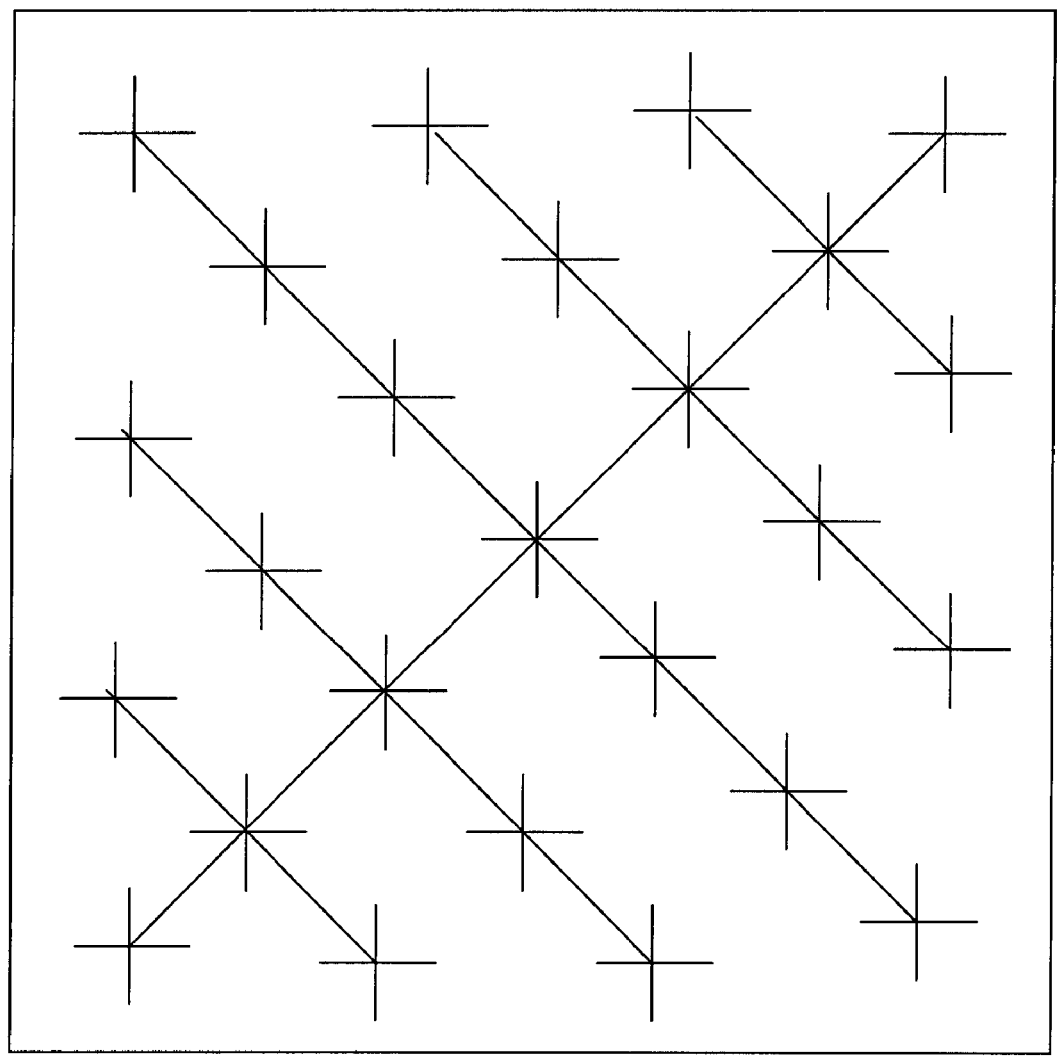
FIG. 7A illustrates a first example embodiment of a herringbone clock signal distribution structure.

FIG. 7A illustrates a first example embodiment of a herringbone clock signal distribution network. The herringbone clock signal distribution architecture of FIG. 7A uses non Manhattan wiring to distribute the clock signal over large areas and local cross structures to distribute the clock signal locally.

Figure 7B:
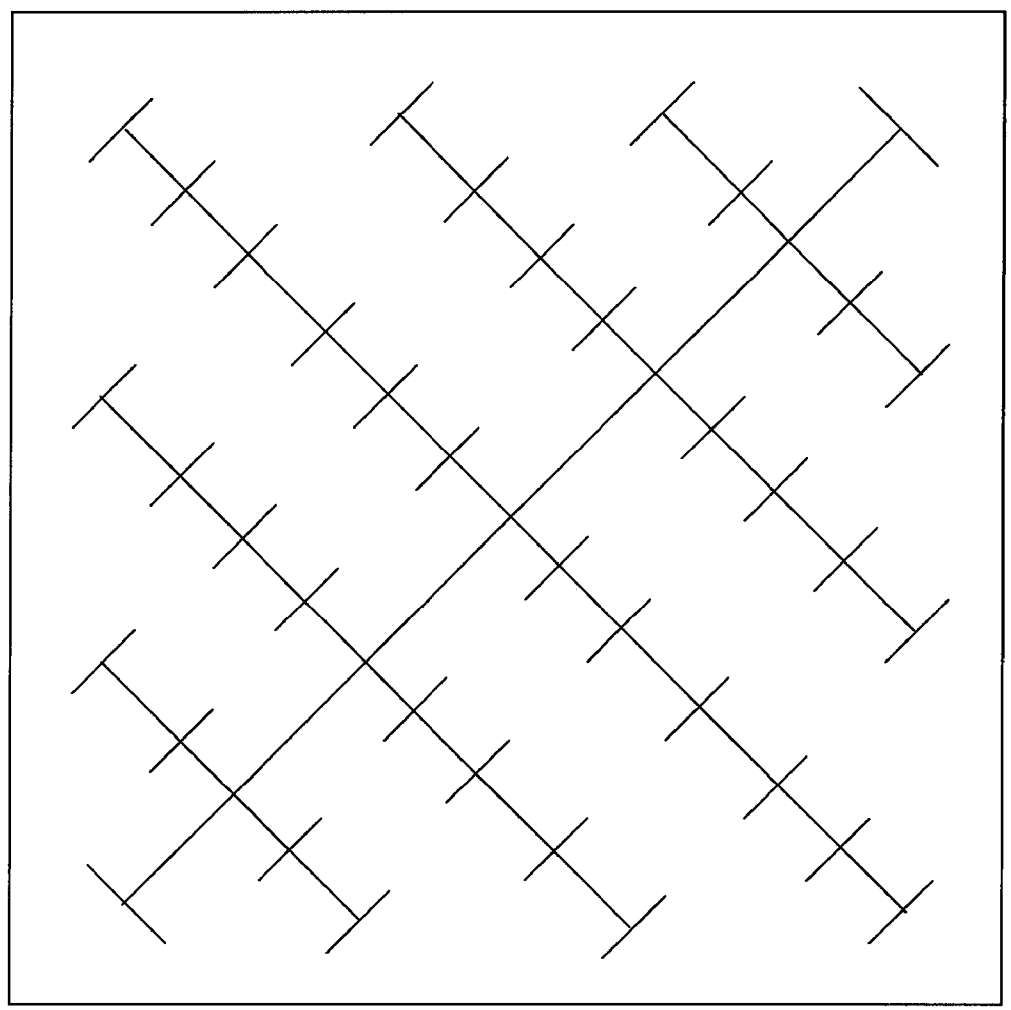
FIG. 7B illustrates a second example embodiment of a herringbone clock signal distribution structure.

FIG. 7B illustrates another embodiment example of a herringbone clock signal distribution network. The of a herringbone clock signal distribution network of FIG. 7B uses non Manhattan wiring to distribute the clock signal globally and locally. Although only two embodiments are illustrated, those skilled in the art could make many different herringbone embodiments using long diagonal runs of wiring to distribute the clock signal across large areas.

Clock Distribution Mesh Networks

Another method of distributing clock signals is to use a clock distribution mesh network. A clock distribution mesh is a set of interconnected wires that provide many different redundant paths that connect any two points on the mesh. Clock distribution meshes are very reliable since any manufacturing defect that harms a single path will not likely prevent the clock signal to be distributed to the desired endpoint. The creation of non Manhattan wiring has allowed a large variety of different clock meshes to be created.

Square Mesh

FIG. 8 illustrates a simple square mesh that may be created using non Manhattan wiring. The square mesh of FIG. 8 is constructed using 45 degree and −45 degree angled wiring. Note that other parallelogram meshes may be created with different angled wiring.

In one embodiment of a square mesh, the clock signal is applied to the center of the mesh at point 810. In another embodiment, the clock signal is applied to the four corner points 831, 832, 833, and 834 of the mesh.

Hexagonal Meshes

Figure 9A:
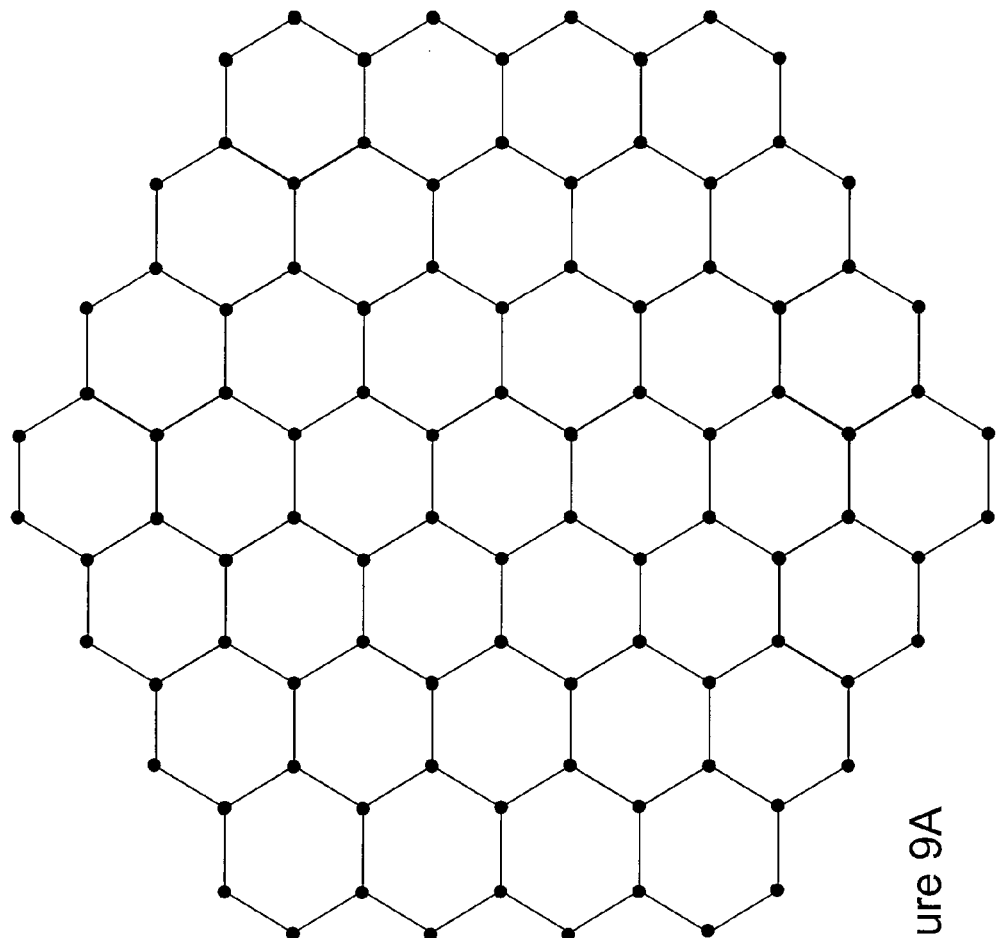
FIG. 9A illustrates an example of a hexagonal mesh clock signal distribution structure constructed using 60 degree, −60 degree, and 0 degree (horizontal) angle wiring.

FIG. 9A illustrates a hexagonal mesh that may be created using non Manhattan wiring. The hexagonal mesh of FIG. 9A is constructed using 60 degree, −60 degree, and 0 degree (horizontal) angled wiring.

Figure 9B:
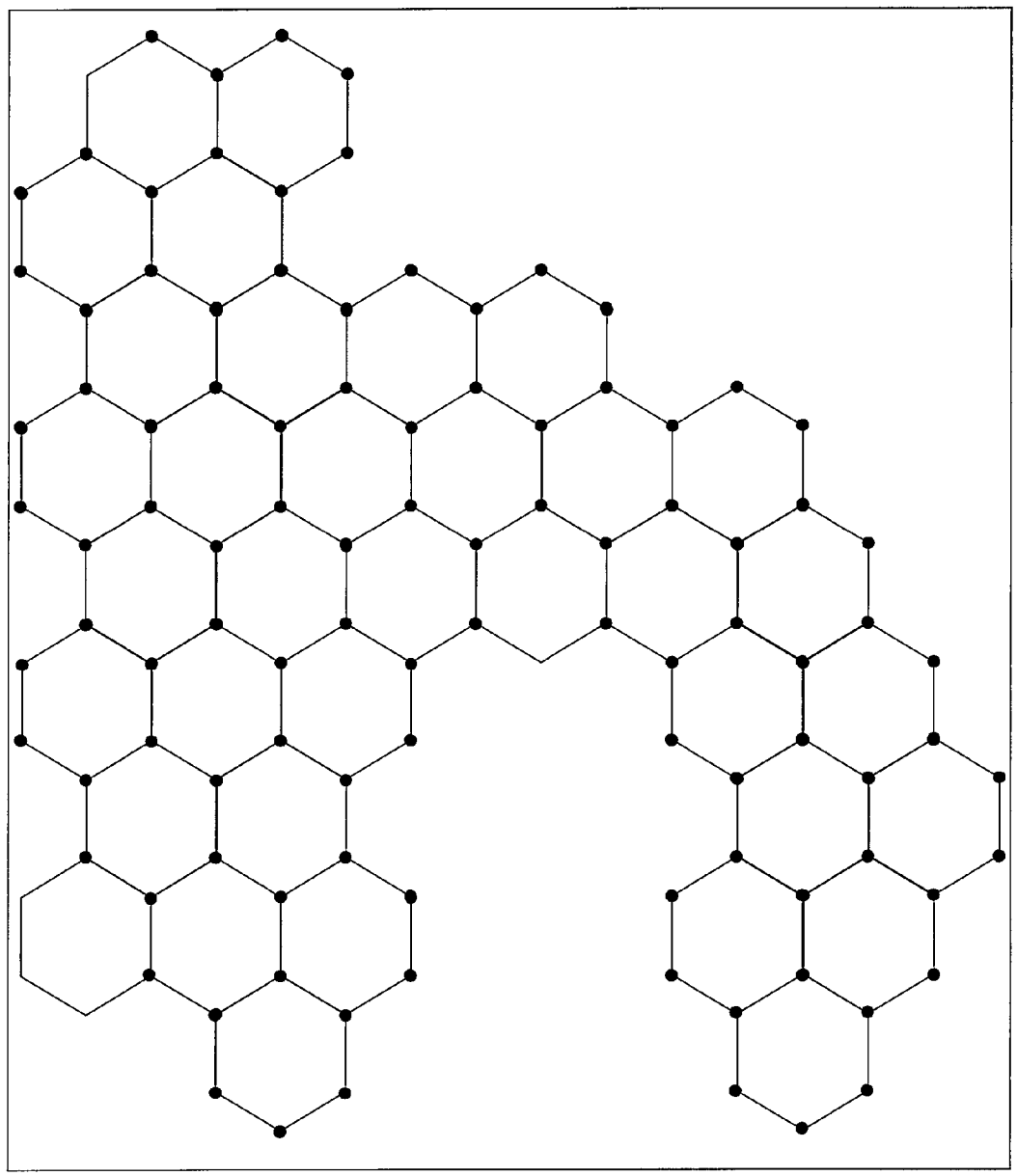
FIG. 9B illustrates an example of an asymmetric hexagonal mesh clock signal distribution structure.

The clock signal distribution mesh structures can be extended in asymmetrical manners such that only portions of the integrated circuit may be covered by the clock signal distribution mesh. For example, FIG. 9B illustrates an asymmetrical clock signal distribution mesh that only covers portions of an integrated circuit. The portions of the metal layer not occupied by the clock signal distribution mesh may be used for other integrated circuit wiring.

Triangular Meshes

Figures 10A, 10B:
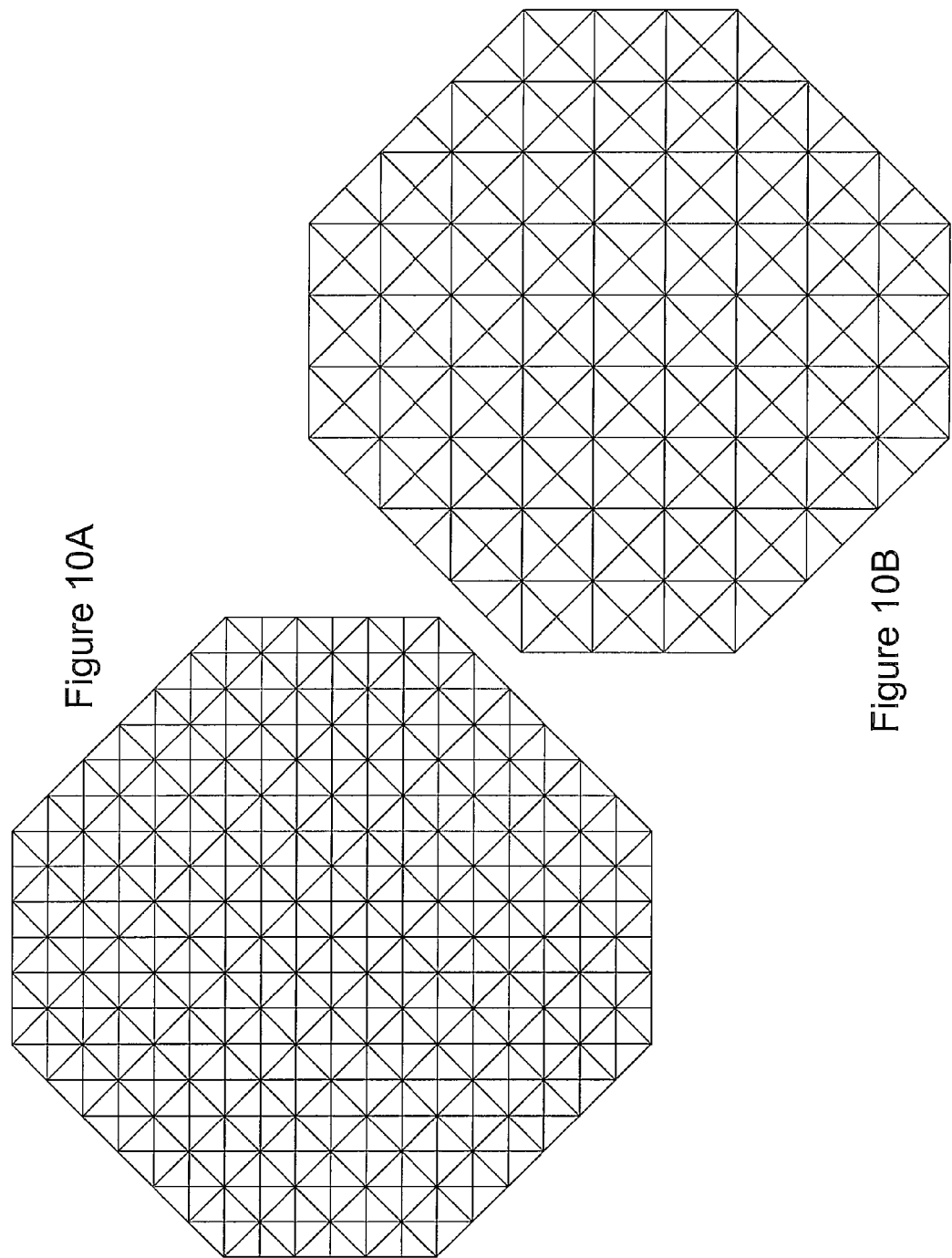
FIG. 10A illustrates an example of a high density triangular mesh clock signal distribution structure.
FIG. 10B illustrates an example of a lower density triangular mesh clock signal distribution structure.

FIG. 10A illustrates a triangular clock signal distribution mesh that may be created using non Manhattan wiring. The triangular clock signal distribution mesh of FIG. 10A is constructed using 45 degree, −45 degree, 0 degree (horizontal), and 90 degree (vertical) angled wiring.

The density of the clock signal distribution mesh may vary. FIG. 10B illustrates a second embodiment of a triangular clock signal distribution mesh that has a lower density than the triangular clock distribution mesh FIG. 10A.

Figure 10C:
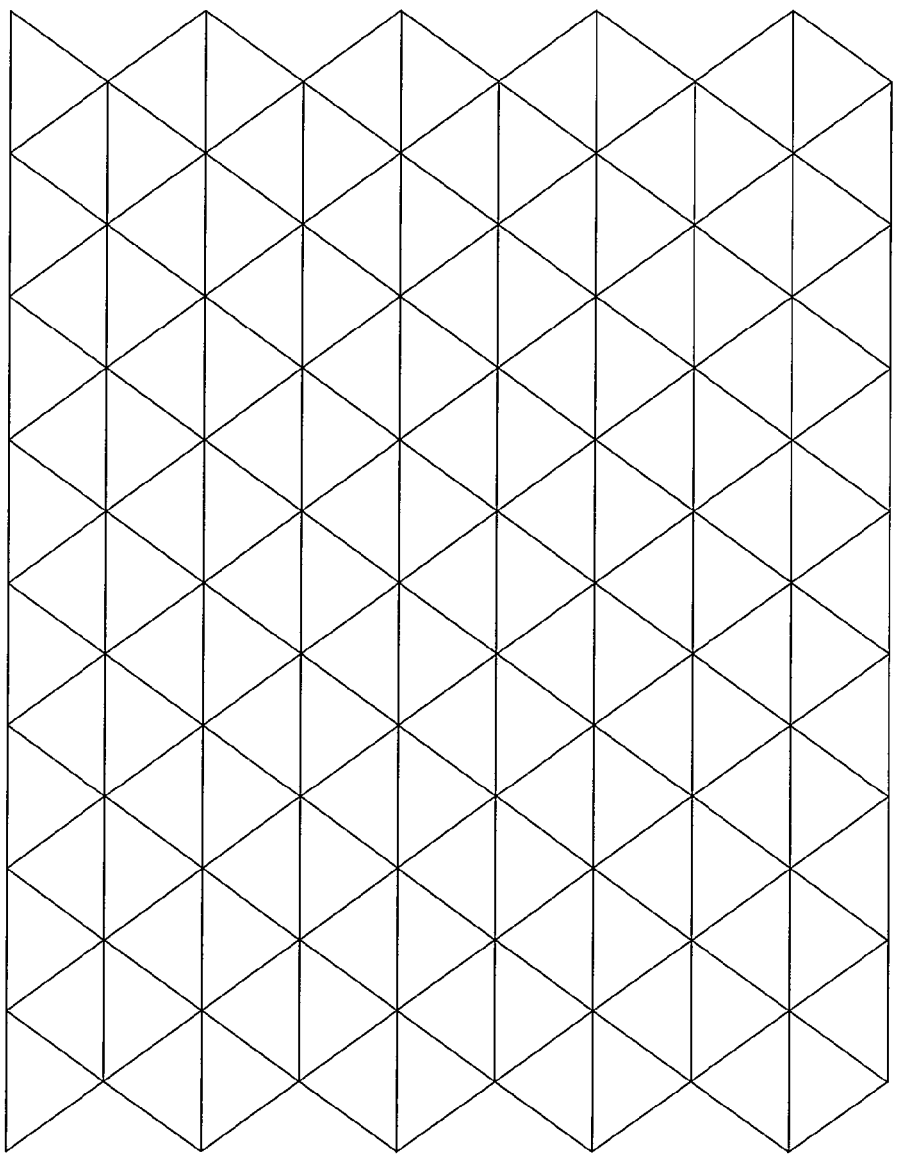

FIG. 10C illustrates yet another possible implementation of a triangular clock distribution mesh. The triangular clock distribution mesh of FIG. 10C only uses 45 degree, −45 degree, and 0 degree (horizontal) angled wiring.

Figure 11A:
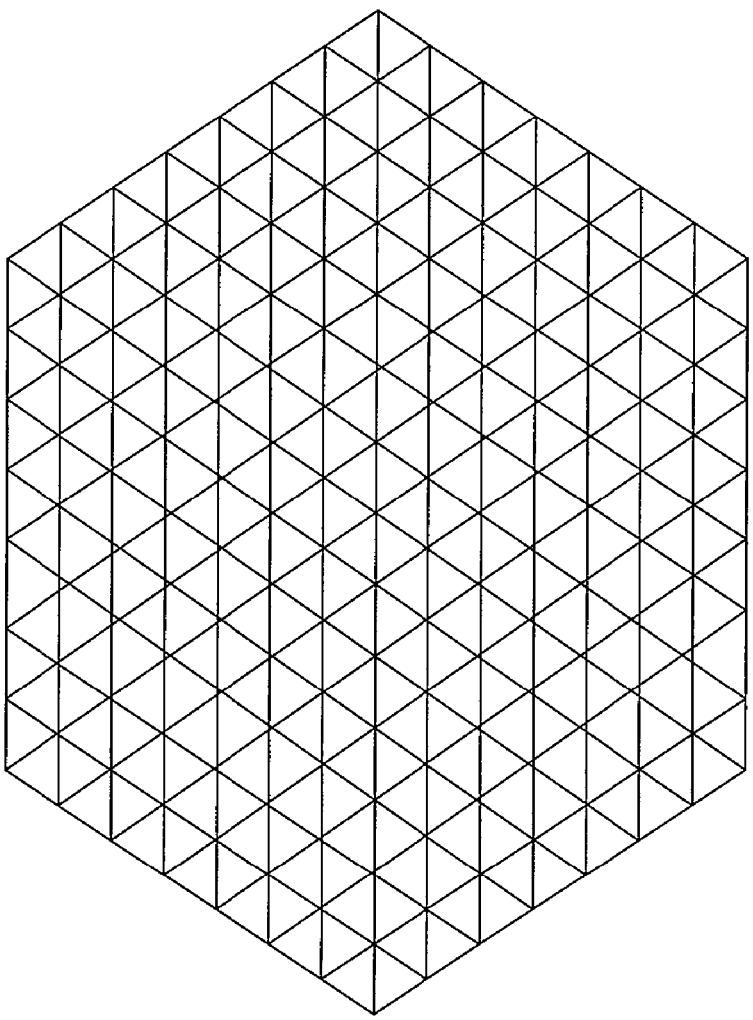
FIG. 11A illustrates an example of a hexagonal shaped triangular mesh clock signal distribution structure.
Figure 11B:
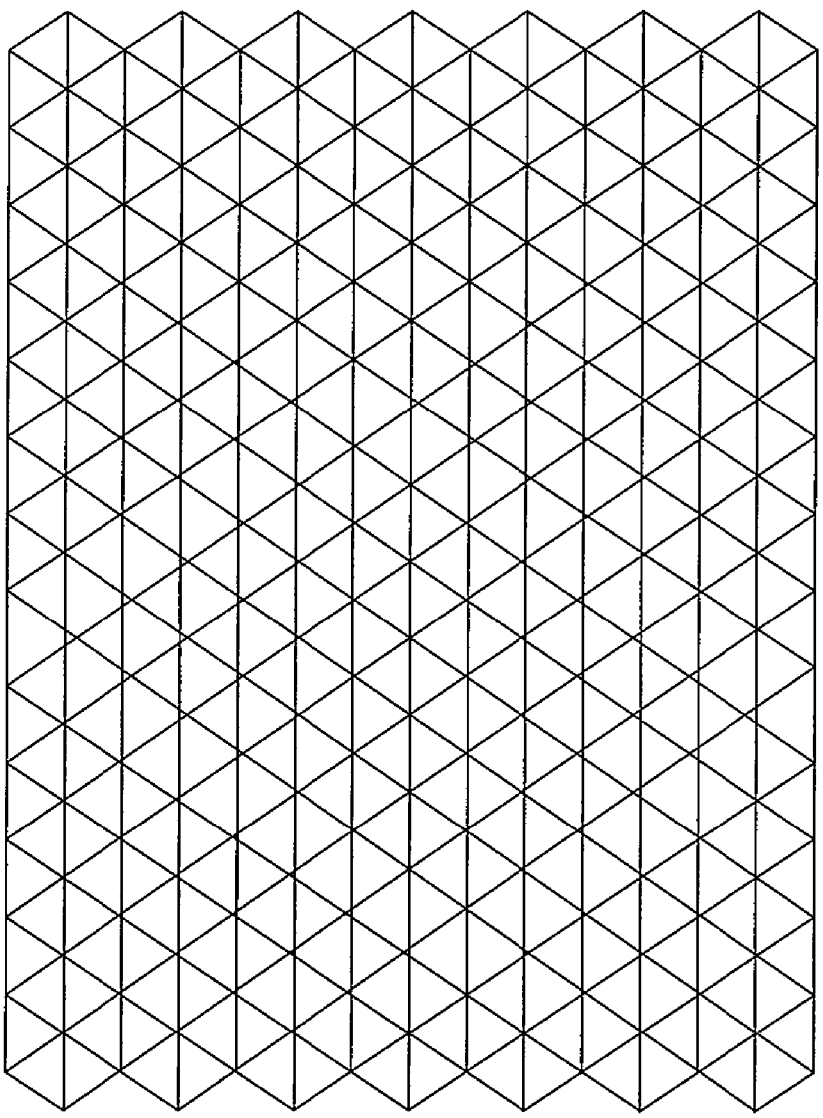
FIG. 11B illustrates an example of a rectangular shaped triangular mesh clock signal distribution structure.

The triangular clock signal distribution mesh structures can also be extended in various manners to create various different shaped clock domain areas. For example, FIG. 11A illustrates a triangular clock signal distribution mesh constructed using 45 degree, −45 degree, and 0 degree (horizontal) angled wiring. FIG. 11B illustrates the triangular clock signal distribution mesh of FIG. 11A extended out into a rectangular shaped area.

Figure 11C:
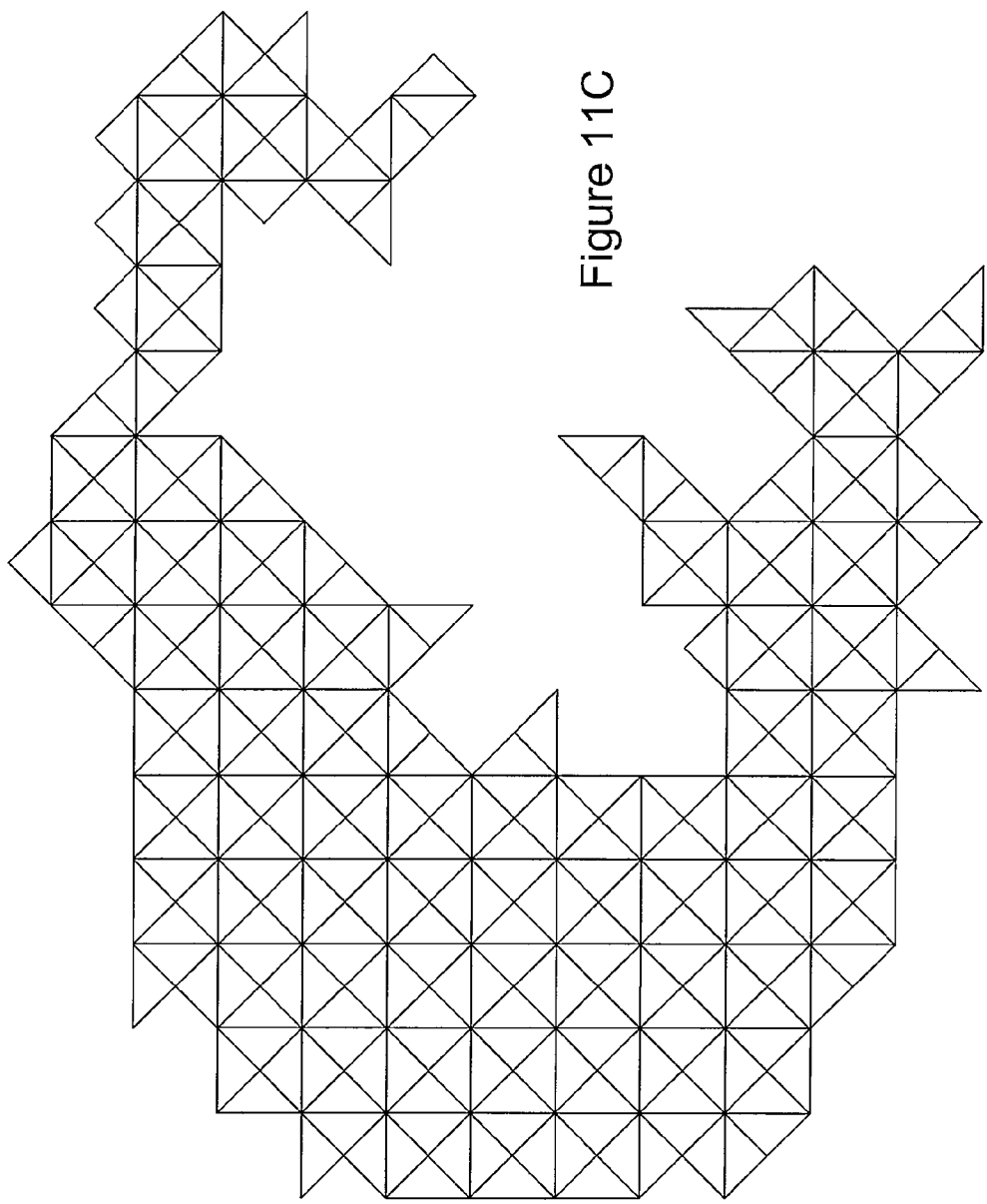

Like the hexagonal clock mesh, the triangular clock signal distribution mesh structures can also be extended in asymmetrical manners such that only portions of the integrated circuit may be covered by the clock signal distribution mesh. For example, FIG. 11C illustrates an asymmetrical clock signal distribution mesh that only covers various portions of an integrated circuit. The portions of the metal layer or layers that are not occupied by the clock signal distribution mesh may be used for other integrated circuit wiring.

Combined Clock Distribution Techniques

The clock signal distribution techniques of the previous sections can be combined to create new clock distribution structures. This section will described some of the various techniques that may be combined to create new clock signal distribution structures.

Clock Signal Distribution To Individual Clock Signal Meshes

Figure 12A:
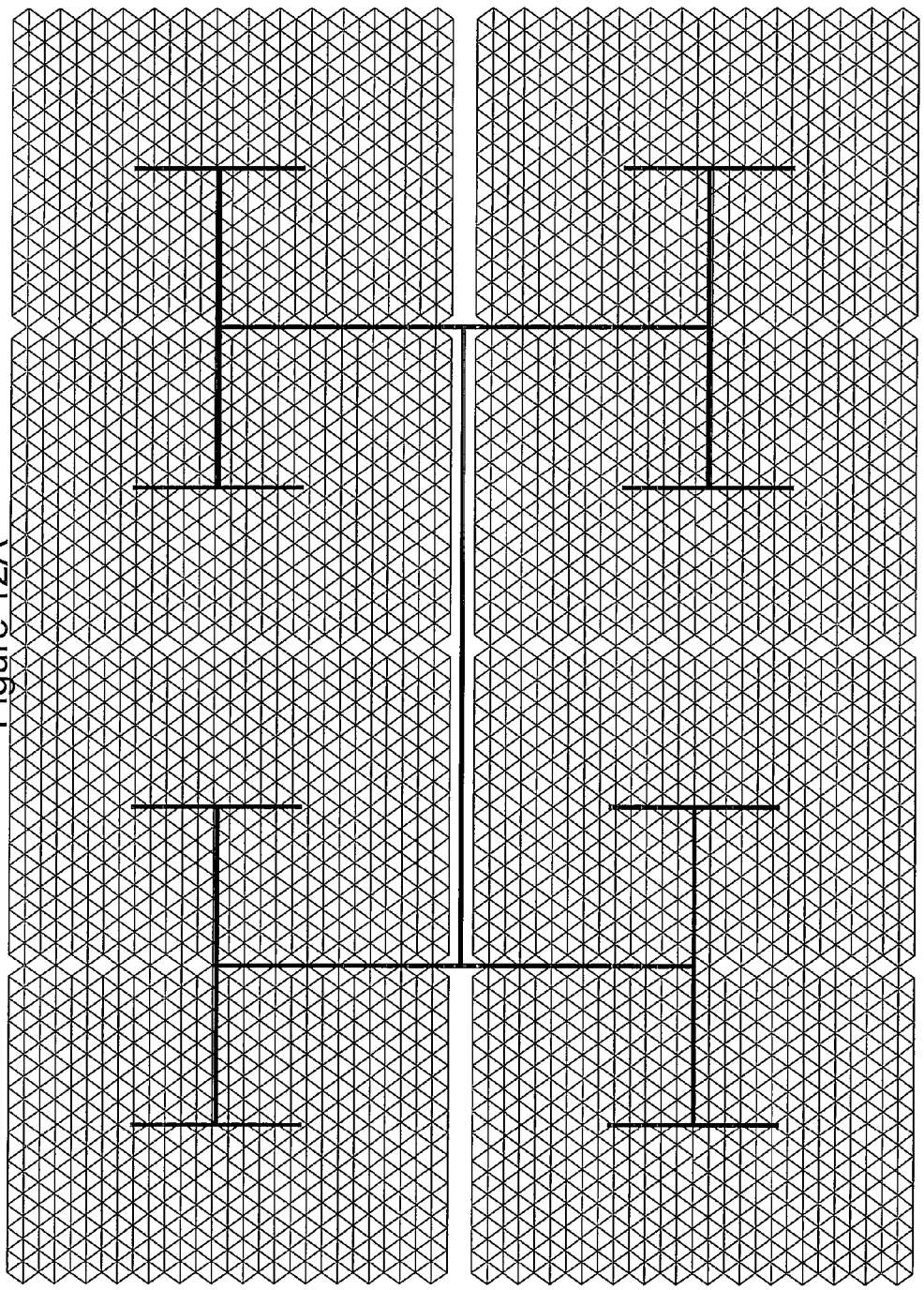
FIG. 12A illustrates an "H" clock signal distribution network that distributes a clock signal to the center of individual rectangular shaped clock signal distribution meshes.
Figure 12B:
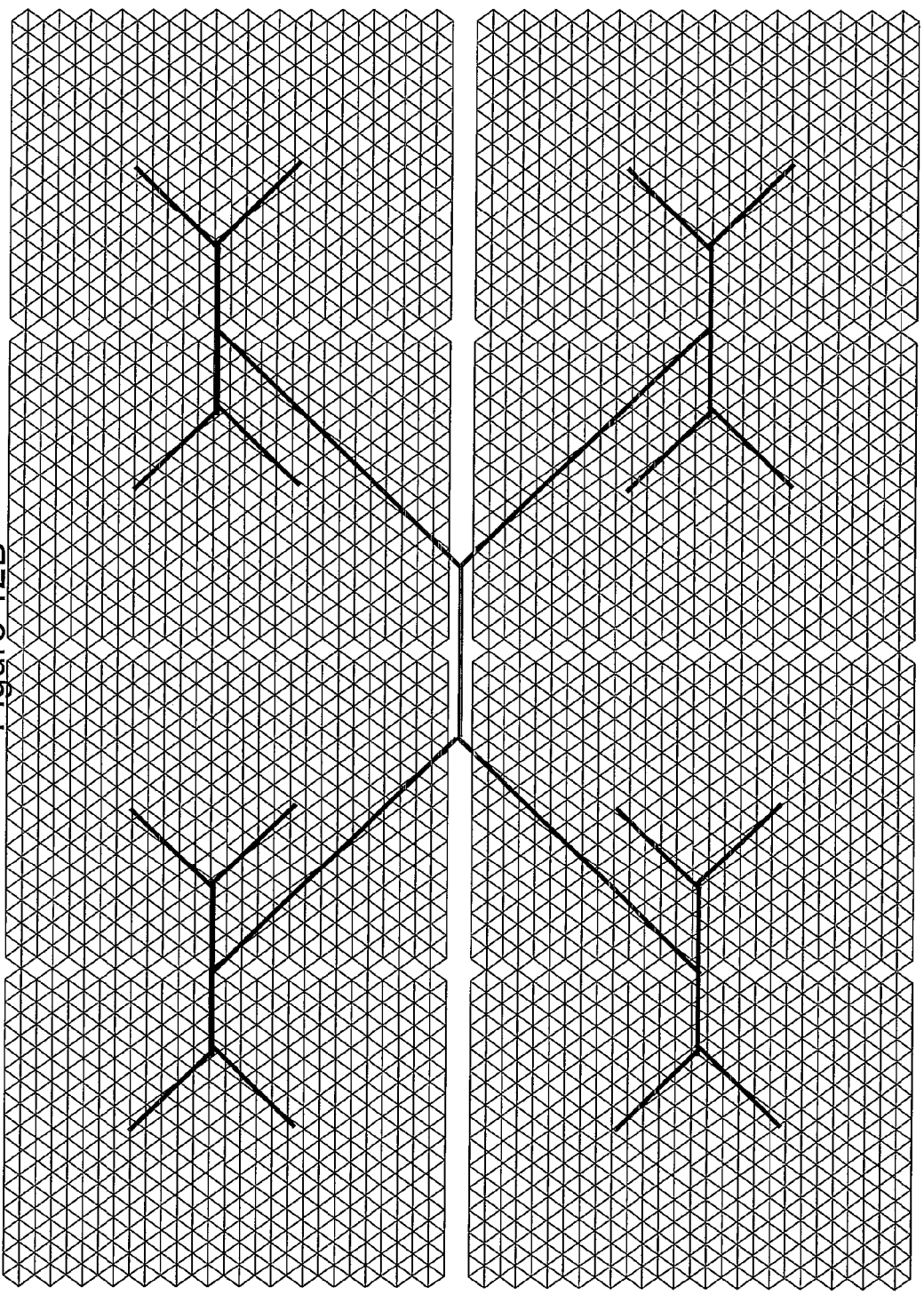
FIG. 12B illustrates a "Y" clock signal distribution network that distributes a clock signal to the center of individual rectangular shaped clock signal distribution meshes.

FIG. 12A illustrates a first combined clock signal distribution technique. In FIG. 12A, an "H" clock signal distribution network distributes a clock signal to the center of individual clock signal meshes. Specifically, two layers of "H" structures distribute a clock signal to the rectangular meshes of the type disclosed in FIG. 11B. FIG. 12B illustrates a similar clock distribution system except that a "Y" clock signal distribution network distributes a clock signal to the center of individual clock signal meshes.

Clock Signal Mesh Distribution To Individual Clock Signal Distribution Structures The techniques may also be combined in reverse order. Specifically, a mesh may be used to distribute a clock signal across a large area of an integrated circuit. Then smaller recursive clock signal distribution structures may locally distribute the clock signal.

Figure 13A:
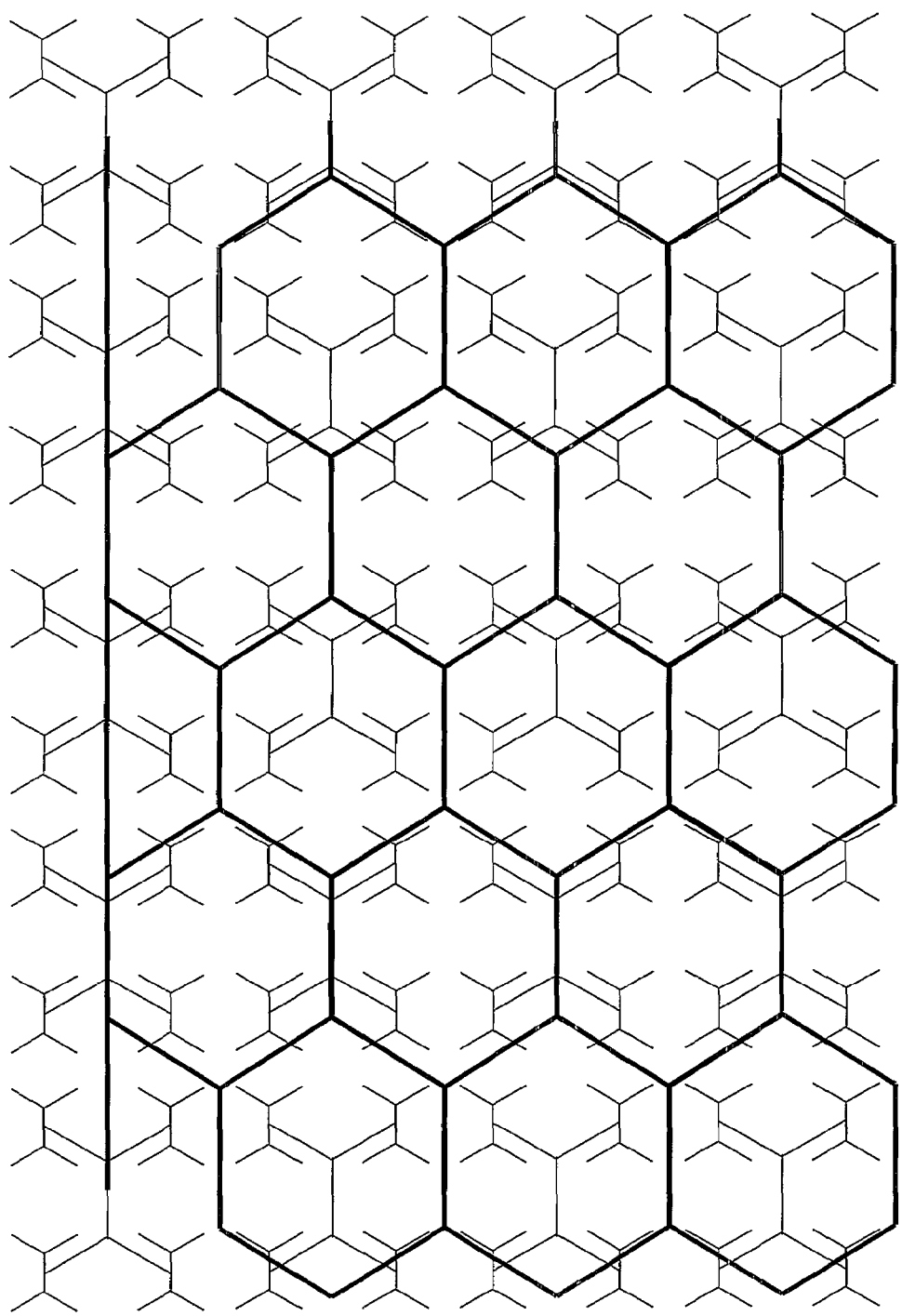
FIG. 13A illustrates a first embodiment of a large hexagonal based clock signal distribution mesh that distributes a clock signal to smaller "Y" clock signal distribution networks that distribute the clock signal in a local area.

For example, FIG. 13A illustrates a first embodiment large hexagonal based clock signal distribution mesh. The large hexagonal clock signal distribution mesh is then coupled to smaller "Y" clock signal distribution networks that distribute the clock signal in a local area.

Figure 13B:
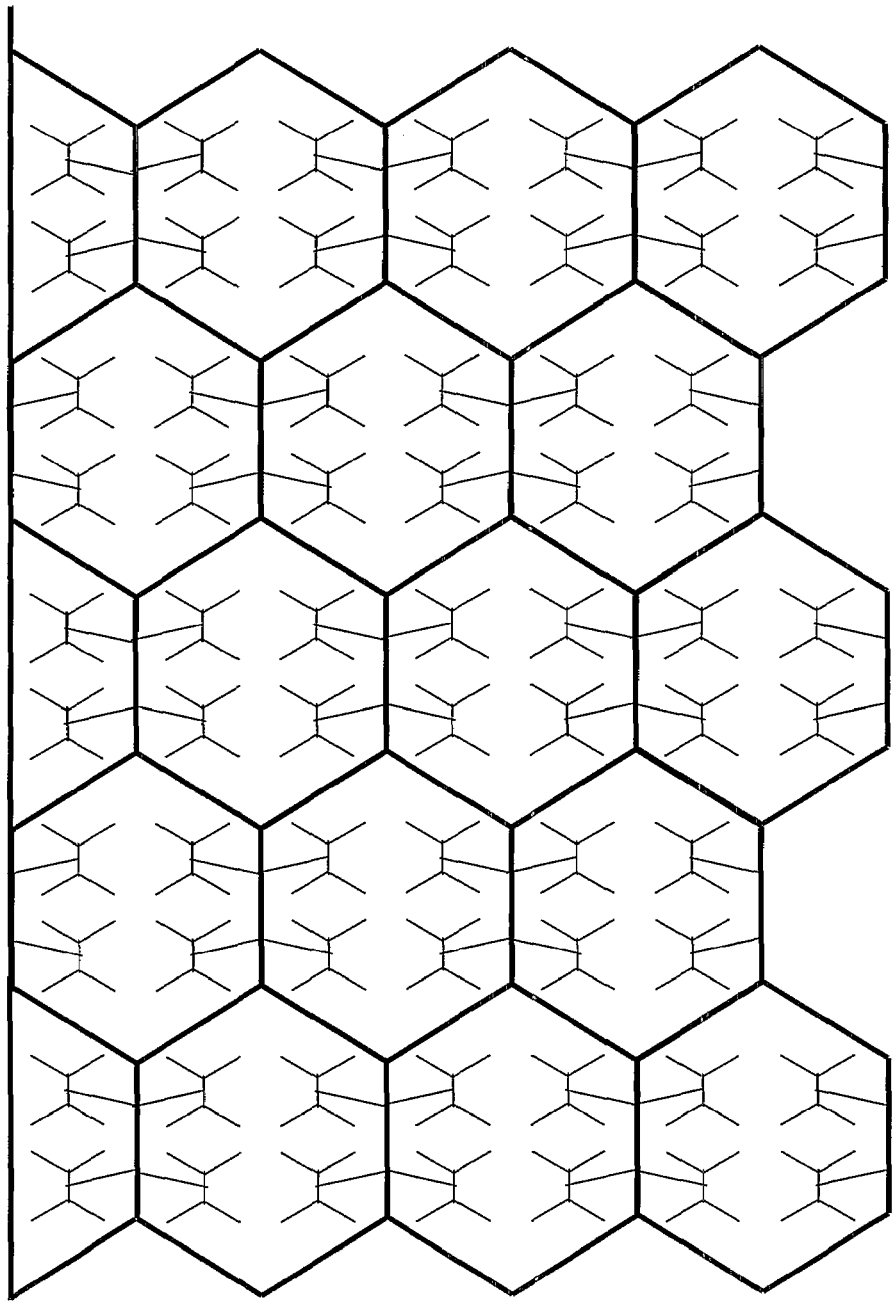
FIG. 13B illustrates a second embodiment of a large hexagonal based clock signal distribution mesh that distributes a clock signal to smaller "Y" clock signal distribution networks that distribute the clock signal in a local area.

FIG. 13B illustrates a second example of a large hexagonal based clock signal distribution mesh that implements smaller "Y" clock signal distribution networks within each hexagon. Note that the smaller "Y" clock signal distribution networks within each hexagon and the coupling wire could be implemented with the same angles of wiring used to created the hexagonal mesh.

Clock Buffer Placement

Clock signals are distributed across large areas on the integrated circuit. To drive the clock signal, buffer circuits are used. A buffer circuit strengthens a clock signal that has traveled a distance along the clock network such that the strengthened signal can continue driving the clock for the rest of clock network.

The non Manhattan architecture clock network structures of the present invention are more efficient than traditional Manhattan clock network structures. Thus, a placer for a non Manhattan integrated circuit system should place fewer buffers on the integrated circuit.

Figure 14:
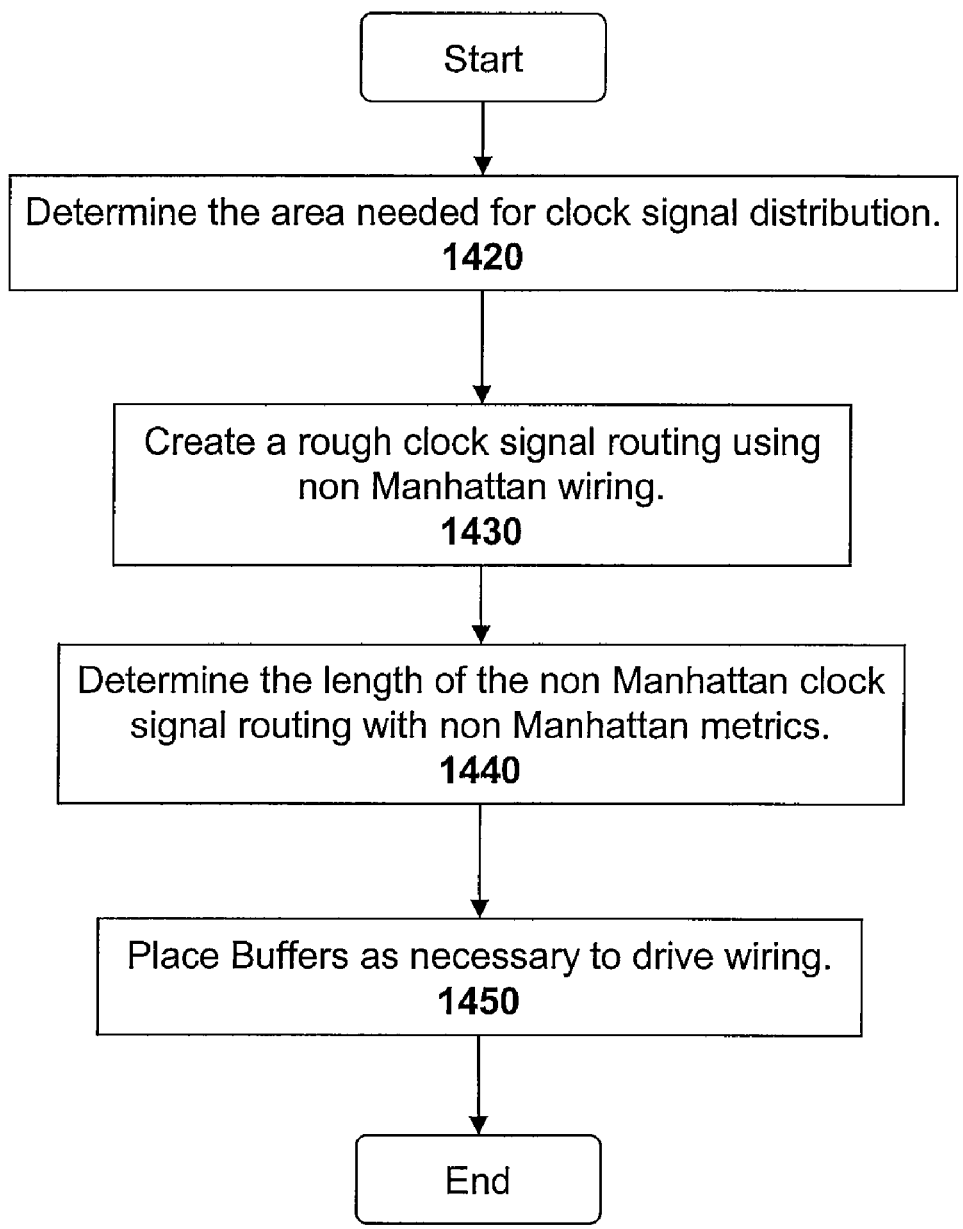
FIG. 14 illustrates a flow diagram that describes a method of placing buffers for reinforcing the clock signal as it passes through a non Manhattan clock signal distribution network.

FIG. 14 illustrates the overall method for determine the placement of buffers in a non Manhattan clocking system. First, at step 1420, the placer determines the areas needed that need to received the clock signal. Next, at step 1430, the system creates a rough clock signal routing for the desired clock signal structure. A detailed routing is not necessary at this point. Then the system determines the wiring length of the clock structure at step 1440. The length of the clock distribution structure is calculated using non Manhattan wiring metrics. This non Manhattan wiring metrics should be shorter than Manhattan wiring metrics since the distances between diagonal points can be joined with diagonal wiring instead of an inefficient combination of horizontal and vertical wiring. Finally, using the non Manhattan wiring lengths, the placer places buffers as necessary to strengthen the clock signal as it is transmitted through the clock network.

The foregoing has described methods and apparatus for distributing clock signals on non Manhattan semiconductor integrated circuits. It is contemplated that changes and modifications may be made by one of ordinary skill in the art, to the materials and arrangements of elements of the present invention without departing from the scope of the invention.

We claim:

1. A clock signal distribution network for an integrated circuit, said clock signal distribution network comprising:
   a plurality of geometric structures, wherein each of said geometric structures comprises:
   a root signal line;
   a first line extending from a first end of said root signal line at a first non orthogonal angle to said root signal line;
   a second line extending from the first end of said root signal line at a second non orthogonal angle to said root signal line;
   a third line extending from a second end of said root signal line at a third non orthogonal angle to said root signal line; and
   a fourth line extending from a the second end of said root signal line at a fourth non orthogonal angle to said root signal line,
   wherein each particular line is a particular wire for distributing a clock signal for synchronizing a set of components of the integrated circuit.

2. The clock signal distribution network of claim 1, wherein said first line and said second line are symmetrical about said root signal line.

3. The clock signal distribution network of claim 2, wherein said third line and said fourth line are symmetrical about said root signal line.

4. The clock signal distribution network of claim 1, wherein at least one geometric structure is coupled at a center of a particular root signal line of another geometric structure.

5. The clock signal distribution network of claim 1, wherein said first line extends at a forty-five degree angle from said root signal line.

6. The clock signal distribution network of claim 1, wherein said first line extends at a sixty degree angle from said root signal line.

7. The clock signal distribution network of claim 1, wherein each of said lines is coupled to a local clock mesh network.

8. The clock signal distribution network of claim 1 further comprising a shielding structure proximate to said root signal line.

9. The clock signal distribution network of claim 1 further comprising a clock signal mesh network that comprises a set of redundant lines that connect any two points on the clock signal mesh network.

10. The clock signal distribution network of claim 9, wherein the clock signal mesh network is a hexagonal clock signal mesh that is defined by 60 degree, −60 degree and horizontal degree lines.

11. The clock signal distribution network of claim 9, wherein the clock signal mesh network is a triangular clock signal mesh that is defined by 45 degree, −45 degree and horizontal degree lines.

12. The clock signal distribution network of claim 1, wherein the clock signal distribution network is for an integrated circuit that comprises at least one wiring layer that has a non-Manhattan preferred wiring direction.

13. The clock signal distribution network of claim 1, wherein a subset of said geometric structures has a same shape, wherein at least two geometric structures in said subset have different sizes.

14. The clock signal distribution network of claim 13, wherein a size of a particular geometric structure is based on a location of the particular geometric structure relative to a location of a first geometric structure having a largest size.

15. The clock signal distribution network of claim 13, wherein a size of a particular geometric structure is based on a distance between the particular geometric structure and a first geometric structure having a largest size.

16. The clock signal distribution network of claim 1, wherein said plurality of geometric structures comprises a plurality of subsets of geometric structures, each subset of geometric structures connect in series to other geometric structures in the subset, wherein the sizes of geometric structures in the subset gets progressively smaller from a geometric structure that starts the series in the subset to a geometric structure that ends the series.

17. A clock signal distribution network for an integrated circuit, said clock signal distribution network comprising:
   a plurality of repeating structures, wherein a size of each particular structure from the plurality of repeating structures is based on a distance between the particular structure and a first structure having a largest size, wherein each of said repeating structures comprises:

a root signal line;

a first line extending from a first end of said root signal line at a first non orthogonal angle to said root signal line;

a second line extending from the first end of said root signal line at a second non orthogonal angle to said root signal line;

a third line extending from a second end of said root signal line at a third non orthogonal angle to said root signal line; and a fourth line extending from the second end of said root signal line at a fourth non orthogonal angle to said root signal line, wherein each particular line is a particular wire for distributing a clock signal for synchronizing a set of components of the integrated circuit.

18. The clock signal distribution network of claim 17, wherein the distance is a length of clock line between the particular structure and the first structure having the largest size.

19. A clock signal distribution network design for an integrated circuit layout that represents an integrated circuit, said clock signal distribution network design comprising:

a plurality of repeating structures, each of the plurality of repeating structures connecting to another repeating structure, wherein each of said repeating structures comprises:

a root signal line;

a first line extending from a first end of said root signal line at a first non orthogonal angle to said root signal line;

a second line extending from the first end of said root signal line at a second non orthogonal angle to said root signal line;

a third line extending from a second end of said root signal line at a third non orthogonal angle to said root signal line; and a fourth line extending from the second end of said root signal line at a fourth non orthogonal angle to said root signal line, wherein each particular line is representative of a particular wire for distributing a clock signal for synchronizing a set of components of the integrated circuit.

20. The clock signal distribution network design of claim 19, wherein a first structure with a largest size appears at a first position on the clock signal distribution network design, wherein the other repeating structures are positioned about the first position, wherein size of the repeating structures decreases as the repeating structures are farther away from the first position.

* * * * *

UNITED STATES PATENT AND TRADEMARK OFFICE
CERTIFICATE OF CORRECTION

PATENT NO. : 7,644,384 B2  
APPLICATION NO. : 11/464478  
DATED : January 5, 2010  
INVENTOR(S) : Teig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 480 days.

Signed and Sealed this

Twenty-first Day of December, 2010

David J. Kappos  
*Director of the United States Patent and Trademark Office*